US011798469B1

(12) United States Patent
    Liu

(10) Patent No.: US 11,798,469 B1
(45) Date of Patent: Oct. 24, 2023

(54) DISPLAY PANEL AND DISPLAY DEVICE

(71) Applicant: Hubei Yangtze Industrial Innovation Center of Advanced Display Co., LTD., Wuhan (CN)

(72) Inventor: Shaowei Liu, Shanghai (CN)

(73) Assignee: HUBEI YANGTZE INDUSTRIAL INNOVATION CENTER OF ADVANCED DISPLAY CO., LTD, Wuhan (CN)

( * ) Notice: Subject to any disclaimer, the term of this patent is extended or adjusted under 35 U.S.C. 154(b) by 0 days.

(21) Appl. No.: 18/081,619

(22) Filed: Dec. 14, 2022

(30) Foreign Application Priority Data

Aug. 19, 2022 (CN) .......................... 202211003532.1

(51) Int. Cl.
    *G09G 3/32* (2016.01)
    *H10K 59/131* (2023.01)

(52) U.S. Cl.
    CPC ............. *G09G 3/32* (2013.01); *H10K 59/131* (2023.02); *G09G 2300/0408* (2013.01); *G09G 2300/0426* (2013.01); *G09G 2300/0819* (2013.01); *G09G 2300/0842* (2013.01)

(58) Field of Classification Search
    CPC ............. G09G 3/32; G09G 2300/0408; G09G 2300/0426; G09G 2300/0819; G09G 2300/0842; G09G 3/34; G09G 3/36; G09G 2300/04; G09G 2300/00; H10K 59/131; H01L 27/3227; H01L 27/3244; H01L 27/32
    See application file for complete search history.

(56) References Cited

U.S. PATENT DOCUMENTS

| 2017/0249903 | A1* | 8/2017 | Xiang | G09G 3/3258 |
| 2022/0310005 | A1* | 9/2022 | Chen | H10K 59/131 |
| 2022/0310742 | A1* | 9/2022 | Yi | H10K 59/131 |
| 2022/0392991 | A1* | 12/2022 | Woo | H10K 59/122 |
| 2023/0067816 | A1* | 3/2023 | Bok | H10K 59/80521 |
| 2023/0105728 | A1* | 4/2023 | Park | G06F 3/0443 |
|  |  |  |  | 345/173 |

FOREIGN PATENT DOCUMENTS

| CN | 111834399 A | 10/2020 |
| CN | 113439339 A | 9/2021 |

* cited by examiner

*Primary Examiner* — Pegeman Karimi
(74) *Attorney, Agent, or Firm* — Anova Law Group, PLLC

(57) ABSTRACT

A display panel and a display device are provided. The display panel includes a first display area including a display light-transmission area, a display transition area, a plurality of first pixel driving circuits located in the display transition area, a plurality of first light-emitting elements, a plurality of signal terminal columns arranged in a second direction, and a plurality of connection wirings extending integrally in the first direction. A signal terminal column includes a plurality of signal output terminals and a plurality of signal input terminals arranged in the first direction, a signal output terminal is electrically connected with an output terminal of a first pixel driving circuit, and a signal input terminal of is electrically connected to at least one light-emitting element, and the signal output terminal and the signal input terminal are electrically connected through a connection wiring.

20 Claims, 21 Drawing Sheets

DISPLAY PANEL AND DISPLAY DEVICE

CROSS-REFERENCE TO RELATED APPLICATION

This application claims the priority of Chinese Patent Application No. 202211003532.1, filed on Aug. 19, 2022, the content of which is incorporated by reference in its entirety.

TECHNICAL FIELD

The present disclosure generally relates to the field of display technologies and, more particularly, relates to a display panel and a display device.

BACKGROUND

With the rapid development of display technologies, the emergence of various display technologies provides infinite possibilities for electronic terminals. In particular, the display technology represented by organic light-emitting diodes has been rapidly applied, and various mobile terminals with "all-screen display", "special-shaped screen display", "under-screen voice", "under-screen fingerprint" and other selling points have begun to be rapidly promoted. Major mobile phone and display panel manufacturers have launched many products with "all-screen display" as the selling point, but most of them still use "notched display", "water-drop notch display" and other near all-screen display designs, this is because the mobile terminal has a front camera, and a certain area has to be reserved to for the camera. Accordingly, the screen-to-body ratio of the display area of the display panel is relatively low. To solve the problem of the low screen-to-body ratio issue of the display area, the technology that the display interface is completely covered by the display screen has been developed. That is, the photosensitive elements are disposed under the screen. Although the display panel of the under-screen photosensitive element increases the screen-to-body ratio, the circuit connection mode in the display panel is chaotic, which does not facilitate automatic wiring. The present disclosed display panels and display devices are direct to solve one or more problems set forth above and other problems in the arts.

SUMMARY

One aspect of the present disclosure provides a display panel. The display panel includes a first display area; and a second display area. The first display area includes a display light-transmission area and a display transition area and, in a first direction, the display transition area includes a sub-display transition area located at at least one side of the display light-transmission area; the first display area includes a plurality of first pixel driving circuits and a plurality of first light-emitting elements, and the plurality of first pixel driving circuits are all located in the display transition area; in the display light-transmission area to the sub-display transition area, the first display area further includes a plurality of signal terminal columns arranged in a second direction, and a signal terminal column of the plurality of signal terminal columns includes a plurality of signal output terminals arranged in the first direction and a plurality of signal input terminals arranged in the first direction, the first direction and the second direction are parallel to a plane where the display panel is located, and the first direction intersects the second direction; and the first display area further includes a plurality of connection wirings extending integrally in the first direction, a signal output terminal of the plurality of signal output terminals is electrically connected with an output terminal of a first pixel driving circuit of the plurality of first pixel driving circuits, and a signal input terminal of the plurality signal input terminals is electrically connected to at least one light-emitting element of the plurality of first light-emitting elements, and the signal output terminal and the signal input terminal are electrically connected through a connection wiring of the plurality connection wirings.

Another aspect of the present disclosure provides a display device. The display device includes a display panel. The display panel includes a first display area; and a second display area. The first display area includes a display light-transmission area and a display transition area and, in a first direction, the display transition area includes a sub-display transition area located at at least one side of the display light-transmission area; the first display area includes a plurality of first pixel driving circuits and a plurality of first light-emitting elements, and the plurality of first pixel driving circuits are all located in the display transition area; in the display light-transmission area to the sub-display transition area, the first display area further includes a plurality of signal terminal columns arranged in a second direction, and a signal terminal column of the plurality of signal terminal columns includes a plurality of signal output terminals arranged in the first direction and a plurality of signal input terminals arranged in the first direction, the first direction and the second direction are parallel to a plane where the display panel is located, and the first direction intersects the second direction; and the first display area further includes a plurality of connection wirings extending integrally in the first direction, a signal output terminal of the plurality of signal output terminals is electrically connected with an output terminal of a first pixel driving circuit of the plurality of first pixel driving circuits, and a signal input terminal of the plurality signal input terminals is electrically connected to at least one light-emitting element of the plurality of first light-emitting elements, and the signal output terminal and the signal input terminal are electrically connected through a connection wiring of the plurality connection wirings.

Other aspects of the present disclosure can be understood by those skilled in the art in light of the description, the claims, and the drawings of the present disclosure.

BRIEF DESCRIPTION OF THE DRAWINGS

To illustrate the technical solutions in the embodiments of the present disclosure more clearly, the following briefly introduces the accompanying drawings used in the description of the embodiments. Obviously, the accompanying drawings in the following description are only some embodiments of the present disclosure, for those of ordinary skill in the art, other drawings can also be obtained from these drawings without creative effort.

DETAILED DESCRIPTION

The embodiments of the present disclosure will be described below with reference to the accompanying drawings in the embodiments of the present disclosure. Obviously, the described embodiments are only a part of the embodiments of the present disclosure, but not all of the embodiments. Based on the embodiments in the present disclosure, all other embodiments obtained by those of ordinary skill in the art without creative efforts shall fall within the protection scope of the present application.

As mentioned in the background art, to solve the problem of low screen-to-body ratio of the display area, the technology in which the display interface is completely covered by the display screen, that is, the photosensitive element is disposed under the screen, has been developed. Although the display panel of the under-screen photosensitive element increases the screen-to-body ratio, the circuit connection mode in the display panel may be chaotic, which may not facilitate to automatic wiring. For example, at the position where the photosensitive element of the display panel corresponds to the display area, the connection lines between the pixel driving circuits and the light-emitting elements are relatively chaotic, including many lines such as jumpers, which does not facilitate the automatic wiring.

The present disclosure provides a display panel and a display device. A signal output terminal and a signal input terminal may be disposed in the display panel. By optimizing the design and the arrangement of the signal output terminal and the signal input terminal to limit the wiring method of connection lines, the chaotic wiring issue may be avoided and the automatic wiring may be facilitated, thereby avoiding the cross-extension of connection lines and bridging at the intersections and reducing the difficulty of forming the circuit.

To achieve the above purposes, the technical solutions provided by the embodiments of the present disclosure are as follows, and the technical solutions provided by the embodiments of the present disclosure are described in detail with reference to FIG. 1 to FIG. 22.

Figure 1:
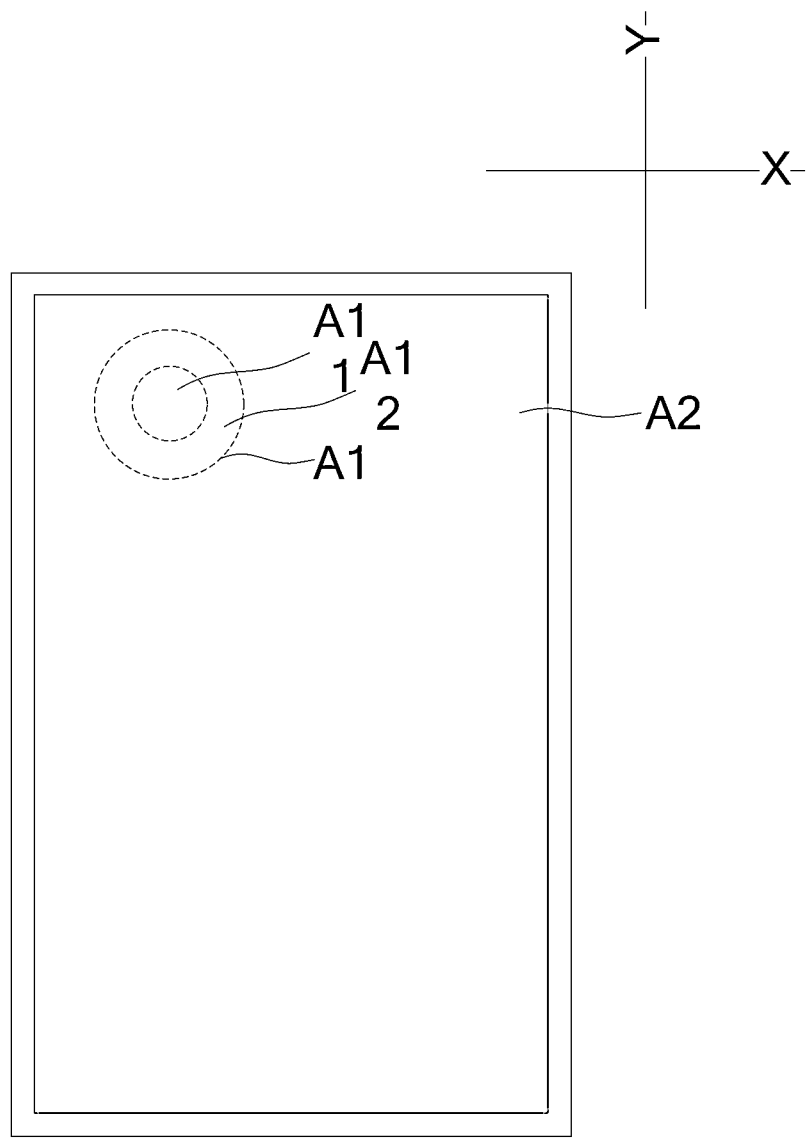
FIG. 1 illustrates an exemplary display panel according to various disclosed embodiments of the present disclosure.
Figure 2:
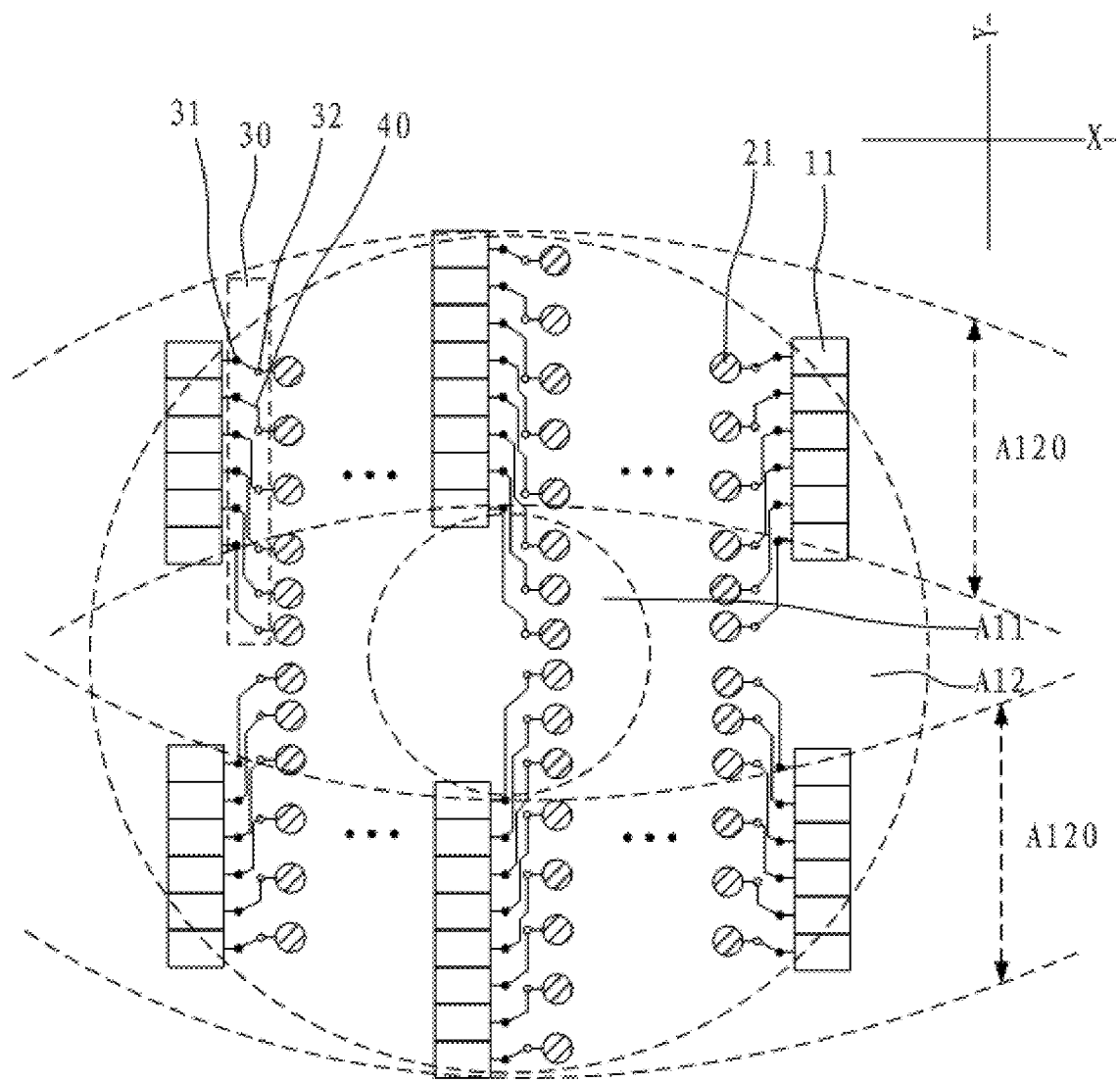
FIG. 2 illustrates an exemplary first display area according to various disclosed embodiments of the present disclosure.

FIG. 1 is a schematic structural diagram of an exemplary display panel according to an embodiment of the present disclosure, and FIG. 2 is a schematic structural diagram of an exemplary first display area according to an embodiment of the present disclosure. As shown in FIGS. 1-2, the display panel provided in the embodiment of the present disclosure may include a first display area A1 and a second display area A2. The first display area A1 may include a display light-transmission area A11 and a display transition area A12. Further, in a first direction Y, the display transition area A12 may include a sub-display transition area A120 located on at least one side of the display light-transmission area A11.

The first display area A1 may include a plurality of first pixel driving circuits 11 and a plurality of first light-emitting elements 21. The plurality of first pixel driving circuits 11 may all be located in the display transition area A12.

In the display light-transmitting area A11 to the sub-display transition area A120, the first display area A1 may further include a plurality of signal terminal columns 30 arranged in a second direction X. A signal terminal column 30 may include a plurality of signal output terminals 31 arranged in the first direction Y and a plurality of signal input terminals 32 arranged in the first direction Y. The first direction Y and the second direction X may be parallel to a plane where the display panel locates, and the first direction Y and the second direction X may intersect each other.

The first display area A1 may further include a plurality of connection lines 40 extending integrally along the first direction Y, and the signal output terminal 31 may be electrically connected to the output terminal of the first pixel driving circuit 11. The signal input terminal 32 may be electrically connected to at least one of the first light-emitting elements 21. The signal output terminal 31 and the signal input terminal 32 may be electrically connected through a connection wiring 40.

It can be seen from the above content that the signal output terminal 31 and the signal input terminal 32 may be disposed in the display panel, and the arrangement of the signal output terminal 31 and the signal input terminal 32 may be optimized to limit the wiring mode of the connection wirings 40 to avoid the wiring confusion and facilitate the automatic wiring. In other words, no matter how the positions of the first pixel driving circuit 11 and the first light-emitting element 21 provided by the present disclosure are arranged, the present disclosure may use the designed signal output terminal 31 and signal input terminal 32 to limit the positions of the connection traces 40, the situation of wiring chaos may be avoided. At the same time, the technical solution provided by the embodiment of the present disclosure may also ensure that the connection wires 40 may be an integrally extending lines. For example, it may be ensured that the connection wires 40 may be unbroken wires formed by etching or other processing of an independent conductive layer. Therefore, it may be possible to avoid the situation that the connection wires 40 are crossed and extended to form bridge structures at the intersections, thereby reducing the difficulty of the fabrication of wires.

It should be noted that the arrangement positions of the first pixel driving circuit 11 and the first light-emitting element 21 shown in FIG. 2 provided by the embodiment of the present disclosure may not the actual positions of the relevant components in the display panel, and FIG. 2 is only provided for the convenience of description of the present disclosure. In the practical application, the first driving circuit 11 and the first light-emitting element may have a stacked arrangement along the thickness direction of the display panel and the specific arrangement is not limited by the present disclosure.

The configuration that the multiple signal output terminals 31 arranged along the first direction Y provided in the embodiment of the present disclosure may not mean that all the signal output terminals 31 are arranged in a straight line. Similarly, the configuration that multiple signal output terminals 32 arranged along the first direction Y may not mean that all the signal output terminals 31 are arranged in a straight line. The configuration may mean that the multiple signal output terminals are arranged along the first direction Y and the spacing between adjacent terminals in the second direction X may not be limited and, in the first direction Y, the distance between two adjacent signal output terminals 31 may be the same or at least partially different, and the distance between two adjacent signal input terminals 32 may be same or at least partially different, which is not specifically limited in the present disclosure.

In one embodiment of the present disclosure, the signal output terminal 31 and the output terminal of the first pixel driving circuit 11 may be mutually independent terminals, and the signal input terminal 32 and the input terminal of the first light-emitting element 21 may be mutually independent terminals. Therefore, the signal output terminal 31 and the signal input terminal 32 may be connected to each other to realize the electrical connection between the first pixel driving circuit 11 and the first light-emitting element 21. In the prior art, the output terminal of the pixel driving circuit needs to be directly connected to the light-emitting element with a design circuit, which requires consideration of windings, crossovers, etc., which makes the circuit design more complicated. Compared with the prior art, the present disclosure may only require the positional layout of the signal output terminal 31 and the signal input terminal 32, which may avoid the situation of chaotic wiring, and facilitate automatic wiring.

The display area provided by the present disclosure may be divided into a first display area A1 and a second display area A2. The first display area A1 may be completely or partially surrounded by the second display area A2. As shown in FIG. 1, in the second direction X, the first display area A1 may be located at a left side in the display area. In other embodiments, in the second direction X, the first display area A1 may be located at the midpoint of the display area, or at a position to the right of the center, or in contact with the left or right edge of the display area, etc., and the portion of the first display area may not be specifically limited to the present disclosure.

The first pixel driving circuit 11 provided in the embodiment of the present disclosure may be configured to provide a driving signal for the first light-emitting element 21, and the first pixel driving circuits 11 may all be disposed at the display transition area A12, thereby eliminating the effect of the first pixel driving circuit 11 to the light transmittance of the display transition area A11. The first pixel driving circuit 11 provided in the embodiment of the present disclosure may be electrically connected to at least one first light-emitting element 21. When the first pixel driving circuit 11 is electrically connected to a plurality of first light-emitting elements 21, the light-emitting colors of the plurality of first light-emitting elements 21 may be same. For example, the plurality of first light-emitting elements may all be red light-emitting elements, green light-emitting elements, or blue light-emitting elements. When the first light-emitting elements are in the first display area A1, the first light-emitting elements 21 may be uniformly arranged to improve the display effect of the first display area A1. Moreover, in the first display area A1, the density of the first light-emitting elements 21 may be gradually reduced in the direction from the display transition area A12 to the display light transmission area A11 to solve the problem of a boundary line of brightness difference between the second display area A2 and the display transition area A12, and between the display transition area A12 and the display light transmission area A11, and at the same time, the light transmittance of the display light transmission area A11 may be further improved.

In one embodiment, the light transmittance of the display transmission area A11 provided in the embodiment of the present disclosure may be greater than the light transmittance of the display transition area A12, and the light transmittance of the display light transmission area A11 may be greater than that of the second display area A2. The light transmittance of the display transition area A12 provided in the embodiment of the present disclosure may be set to be greater than the light transmittance of the second display area A2. Thus, through the setting of the display transition area A12, the light transmittance may be smoothly changed from the second display area A2 with a smaller light transmittance to the display light transmission area A11 with a larger light transmittance to ensure that the brightness difference of the display panel may be substantially small at the boundaries at the second display area A2, the display transition area A12 and the display light-transmitting area A11, and the display effect may be improved.

The second display area A2 provided by the embodiment of the present disclosure may include a second pixel driving circuit and a second light-emitting element (not shown), and the second pixel driving circuit may be configured for providing a driving signal for the second light-emitting element. The density of the second pixel driving circuits in the second display area A2 may be greater than or equal to the density of the first pixel driving circuits 11 in the display transition area A12. The density of the second light-emitting elements in the second display area A2 may be set to be greater than or equal to the density of the first light-emitting elements 11 in the light-transmitting area A11, and/or greater than or equal to the density of the first light-emitting elements 11 in the transition area A12. The second pixel driving circuit provided in the embodiment of the present disclosure may be electrically connected to at least one second light-emitting element. When the second pixel driving circuit is electrically connected to a plurality of second light-emitting elements, the light-emitting colors of the plurality of second light-emitting elements may be same, such as red, green, or blue.

The first direction and the second direction provided in this embodiment of the present disclosure may intersect each other. In one embodiment, the first direction and the second direction may be perpendicular. The display panel may include a plurality of data lines, the first direction Y may be the extension direction of the data lines, and the second direction X may be the arrangement direction of the plurality of data lines. In some embodiments, the first direction Y may be the arrangement direction of the plurality of data lines, and the second direction X may be the extension direction of the data lines, which is not specifically limited in the present disclosure.

The technical solution provided by the present disclosure will be described in more detail below. To facilitate a clearer description of the relationship between the signal output terminal, the signal input terminal and the connection wiring provided by the present disclosure, the present disclosure uses the configuration that the signal output terminal and the signal input terminal are respectively located in the relative position in the first direction as an example.

Figure 3:
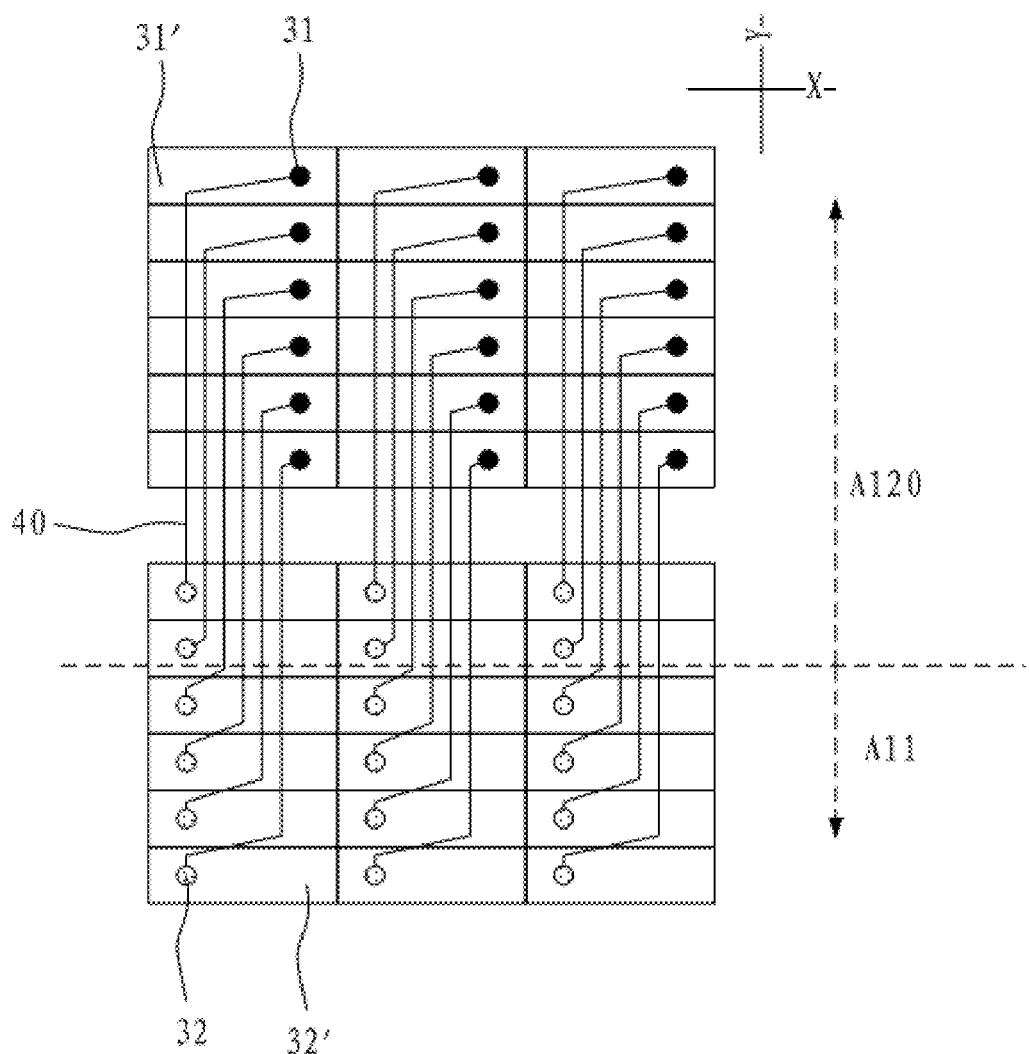
FIG. 3 illustrates an exemplary signal terminal column according to various disclosed embodiments of the present disclosure.

FIG. 3 is a schematic structural diagram of an exemplary signal terminal column provided by an embodiment of the present disclosure. As shown in FIG. 3, the signal terminal column 30 provided by the embodiment of the present disclosure may include a plurality of signal output terminals 31 arranged along the first direction Y and a plurality of signal input terminals 32 arranged in the first direction Y, and the signal output terminals 31 and the signal input terminals 32 are electrically connected through connection wirings 40.

It can be understood that, in the embodiment of the present disclosure, the arrangement of the signal output terminals 31 and the signal input terminals 32 may be optimally designed to limit the wiring manner of the connection wirings 40. For example, in the embodiment of the present disclosure, the area from the display light-transmitting area A11 to the sub-display transition area A120 may be divided into a plurality of terminal areas along the second direction X, and each terminal area may include a plurality of signal output area 31' arranged in the first direction Y and a plurality of signal input areas 32' arranged in the first direction Y, and then the signal output terminal 31 may be correspondingly arranged in the signal output area 31' to define the position of the signal output terminal 31, and the signal input terminal 32 may be correspondingly arranged in the signal input area 32' to limit the position of the signal input terminal 32', and the signal output terminal 31 and the signal input terminal 32 may be connected through the connection wiring 40 extending integrally such that the signal output terminal 31, the signal input terminal 32 and the connection wiring 40 may be optimized and limited. In such a manner, the situation of chaotic wiring in the display panel may be avoided.

Figure 4:
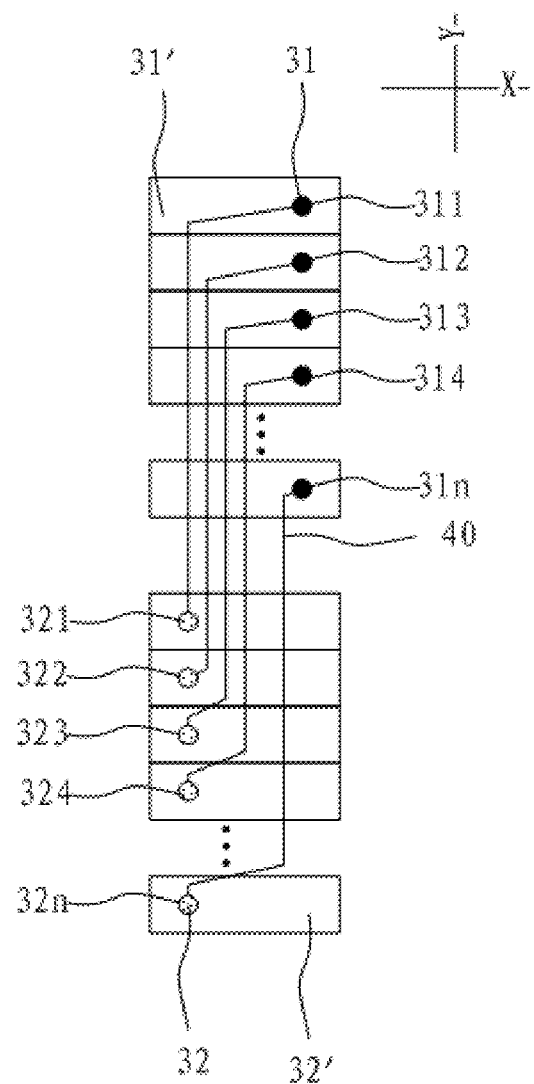
FIG. 4 illustrates another exemplary signal terminal column according to various disclosed embodiments of the present disclosure.

Further, as shown in FIG. 3, the integrally extending connection wiring 40 provided by the embodiment of the present disclosure may mean that the entire connection wiring 40 may be located on the same layer and formed by the same conductive film layer, and the connection wiring 40 may not have intermediate disconnection and/or may not bridge between different layers in the path from the signal output terminal 31 to the signal input terminal 32. The configuration that the connection wiring 40 provided in the embodiment of the present disclosure may extend along the first direction Y may mean that the overall extension direction of the connection wiring 40 may be arranged in the first direction Y, and when the connection wring 40 is extended in the first direction Y, the connection wiring 40 may be a straight line segment as whole; or, the overall wiring trend of the connection wiring 40 may be to extend along the first direction Y, and the extension path may appear in the wiring segment, or arc segment, etc., which is not specifically limited by the present disclosure FIG. 4 a schematic structural diagram of another exemplary signal terminal column provided by an embodiment of the present disclosure. As shown in FIG. 4, in the signal terminal column, the plurality of signal output terminals 31 may include the first signal output terminal 311 to the N-th signal output terminal 31$n$ arranged in sequence in the first direction Y, and the plurality of signal input terminals 32 may include the first signal input terminal 321 to the N-th signal input terminal 32$n$ arranged in sequence in the first direction Y. The arrangement direction of the first signal output terminal 311 to the N-th signal output terminal 31$n$ may be same as the arrangement direction of the first signal input terminal 321 to the N-th signal input terminal 32$n$. The i-the signal output terminal may be electrically connected to the i-th signal input terminal through one of the connection wirings 40. N may be an integer not less than 2, and i may be a positive integer not greater than N.

It can be understood that the first signal output terminal 311 to the N-th signal output terminal 31$n$ provided in the embodiment of the present disclosure may be arranged in sequence in the first direction Y, and the first signal input terminal 321 to the N-th signal input terminal 32$n$ may be arranged in sequence in the first direction Y, and the direction of the first signal output terminal 311 pointing to the N-th signal output terminal 31$n$ may be same as the direction of the first signal input terminal 321 pointing to the N-th signal input terminal 32$n$. Accordingly, the i-th signal output terminal may be electrically connected to the i-th signal input terminal through the connection wiring 40. Such a structure may ensure that the lengths of most connection wirings 40 may be the smallest, ensuring that the signal transmission performance of the connection wirings 40 may be as desired, and the influence of connection wiring 40 to the display light-transmission area A11 may be reduced and the light transmittance of the display light-transmission area A11 may be increased. At the same time, the crossover between the connection wirings 40 may be be avoided, and the connection wirings 40 may meet the expected effects of integral extension.

The present disclosure does not limit the arrangement of the signal output terminals 31 and the signal input terminals 32 in a same signal terminal column, and the arrangement may only need to satisfy that the arrangement of the signal output terminals 31 and the signal input terminals 32 may be able to limit the connection wirings 40 to extend integrally. Several arrangements to which the present display may be applied are described in detail below.

Figure 5:
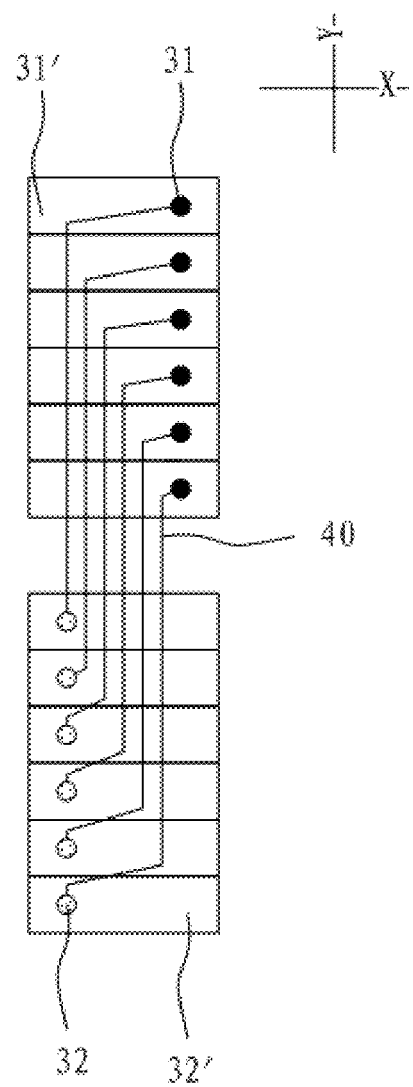
FIG. 5 illustrates another exemplary signal terminal column according to various disclosed embodiments of the present disclosure.

FIG. 5 is a schematic structural diagram of another exemplary signal terminal column provided by an embodiment of the present disclosure. As shown in FIG. 5, in the signal terminal row, the plurality of signal output terminals 31 may be located at a first side of the signal terminal column in the second direction X, and the plurality of signal input terminals 32 may be located at a second side of the signal terminal column in the second direction X. The first side of the signal terminal column and the second side of the signal terminal column may the opposite sides in the second direction X.

It can be understood that the first side and the second side of the signal terminal column in the second direction X provided by the embodiment of the present disclosure do not limit specific directions. For example, the first side of the signal terminal column in the second direction X may be the left side of the viewing line, and the second side of the signal terminal column in the second direction X may be the right side of the viewing line. In some embodiments, the first side of the signal terminal column in the second direction X may be the right side shown by the viewing line, and the second side of the signal terminal column in the second direction X may be the left side as shown by the viewing line. In the same signal terminal column provided by the embodiment of the present disclosure, all signal output terminals 31 may be located on the same side of the signal terminal column in the second direction X, and all signal input terminals 32 may be located in the signal terminal column in the second direction X. The signal output terminal 31 and the signal input terminal 32 may be located at the opposing sides of the signal terminal column in the second direction X, thereby expanding the application range of the signal terminal column in different types of display panels. Further, when the signal output terminals 31 and the signal input terminals 32 are arranged at the opposing sides in the second direction X, it may be only necessary to design the circuit connection along the direction from the signal output terminal 31 to the signal input terminal 32, which may reduce the design difficulty.

Figure 6:
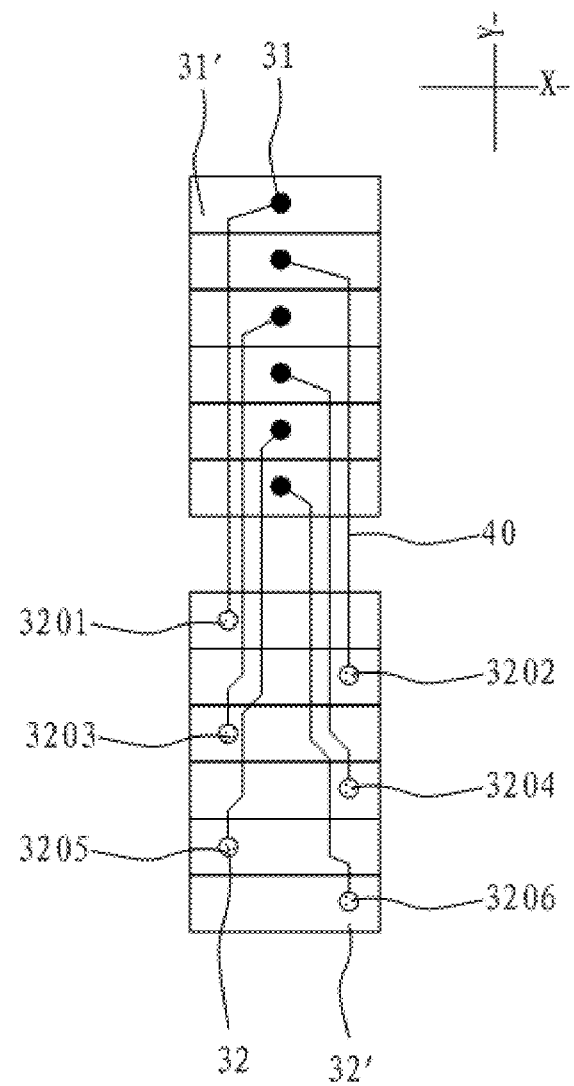
FIG. 6 illustrates another exemplary signal terminal column according to various disclosed embodiments of the present disclosure.

FIG. 6 is a schematic structural diagram of another exemplary signal terminal column provided by an embodiment of the present disclosure. As shown in FIG. 6, in the signal terminal column, the plurality of signal input terminals 32 may be sequentially divided into a first signal input terminal group to an M-th signal input terminal group (as shown in FIG. 6, when M is 6, the terminal groups may include the first signal input terminal group 3201 to the sixth signal input terminal group 3206), and a signal input terminal group includes at least one of the signal input terminals 32. The j-th signal input terminal group may located at the first side of the signal terminal column in the second direction X, and the (j+1)-th signal input terminal group may be located at the second side of the signal terminal column in the second direction X. The first side of the signal terminal column and the second side of the signal terminal column may be opposing sides in the second direction X. M may be an integer not less than 2, and j may be a positive integer less than M. The plurality of signal output terminals 31 may be located between the first side of the signal terminal column and the second side of the signal terminal column.

Figure 7:
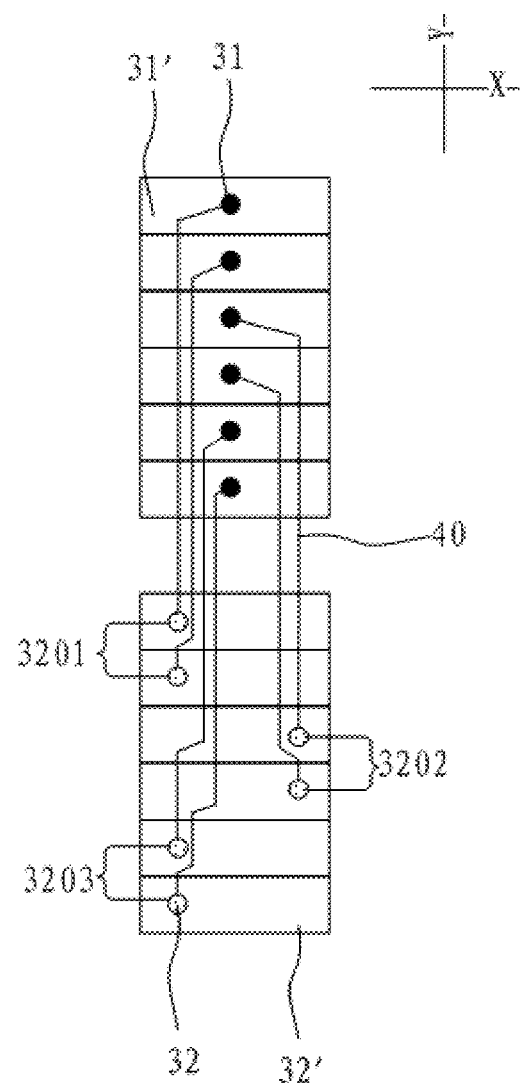
FIG. 7 illustrates another exemplary signal terminal column according to various disclosed embodiments of the present disclosure.

It can be understood that in the signal terminal column provided by the embodiment of the present disclosure, all the signal output terminals 31 may be arranged in a straight line or substantially a straight line in the first direction Y, and the signal output terminals 31 may be arranged between the two sides of the signal terminal column in the second direction X. At the same time, the distribution of the signal input terminals 32 may be optimized, the signal input terminals 32 may be grouped in the first direction Y, and then two adjacent groups may be arranged at different sides of the signal terminal column in the second direction X, respectively. In other embodiments of the present disclosure, all signal input terminal groups may also be disposed at different sides of the signal terminal column in the second direction X in a manner of spacing multiple groups, which is not specifically limited in the present disclosure. Thus, the applicable scope of the signal terminal column in different types of display panels may be extended. As shown in FIG. 6, a signal input terminal group provided in this embodiment of the present disclosure may include one signal input terminal 32. In some embodiment, as shown in FIG. 7, a signal input terminal group provided by an embodiment of the present disclosure (the groups may include the first signal input terminal group 3201 to the third signal input terminal group 3203 when M is 3 as shown in FIG. 7) may include multiple signal input terminal 32. It should be noted that, the numbers of the signal input terminals included in the different signal input terminal groups provided in the embodiments of the present disclosure may be same or at least partially different.

As shown in FIG. 6 and FIG. 7, the connection wiring 40 corresponding to the j-th signal input terminal group provided in the embodiment of the present disclosure may be located between the plurality of signal output terminals 31 and the first side of the signal terminal column and the connection wiring 40 corresponding to the (j+1)-th signal input terminal group may be located between the plurality of signal output terminals 31 and the second side of the signal terminal column. Through unifying the directions and positions of the connection wirings 40 connected to different signal input terminal groups, the layout of the wirings may be facilitated.

Figure 8:
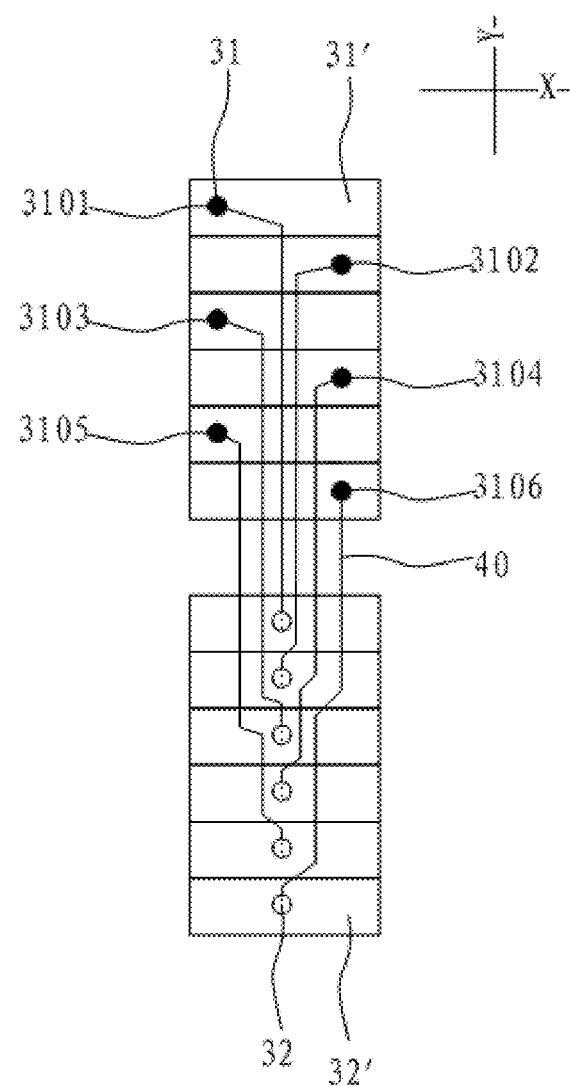
FIG. 8 illustrates another exemplary signal terminal column according to various disclosed embodiments of the present disclosure.

FIG. 8 is a schematic structural diagram of another exemplary signal terminal column provided by an embodiment of the present disclosure. As shown in FIG. 8, in the signal terminal column, the plurality of signal output terminals 31 are sequentially divided into a first signal output terminal group to an M-th signal output terminal group (as shown in FIG. 8 when M is 6, the first signal output terminal group 3101 to the sixth signal output terminal group 3106) in the first direction Y. A signal output terminal group may include at least one of the signal output terminals 31. The j-th signal output terminal group may be located at the first side of the signal terminal column in the second direction X, and the (j+1)-th signal output terminal group may be located at the second side of the signal terminal column in the second direction X. The first side of the signal terminal column and the second side of the signal terminal column are opposing sides in the second direction X, M may be an integer not less than 2, and j may be a positive integer less than M. The plurality of signal input terminals 32 may be located between the first side of the signal terminal column and the second side of the signal terminal column.

It can be understood that, in the signal terminal column provided by the embodiment of the present disclosure, all the signal input terminals 32 may be arranged in a straight line or substantially in a straight line in the first direction Y, and the signal input terminals 32 may be arranged at the positions between the two sides in the signal terminal column in the second direction X. At the same time, the distribution of the signal output terminals 31 may be optimized, and the signal output terminals 31 may be grouped along the first direction Y, and then two adjacent groups may be arranged at different sides of the signal terminal column in the second direction X, respectively. In some embodiments of the present disclosure, the signal output terminal groups may also be arranged at different sides of the signal terminal column in the second direction X in a manner of spacing multiple groups, which is not specifically limited in the present disclosure, thus expanding the applicable scope of the signal terminal column in different types of display panels.

Figure 9:
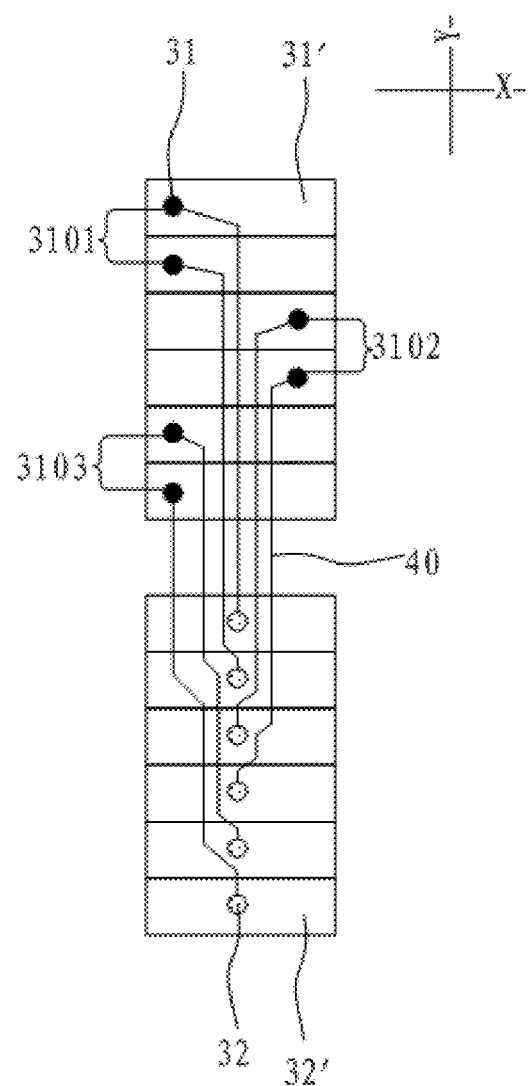
FIG. 9 illustrates another exemplary signal terminal column according to various disclosed embodiments of the present disclosure.

As shown in FIG. 8, a signal output terminal group provided in this embodiment of the present disclosure may include one signal input terminal 31. Alternatively, as shown in FIG. 9, a signal output terminal group provided by an embodiment of the present disclosure (the signal output terminal groups may include the first signal output terminal group 3101 to the third signal output terminal group 3103 when M is 3 as shown in FIG. 9) may include multiple signal output terminals 31. It should be noted that, the number of the signal output terminals included in the different signal output terminal groups provided in the embodiment of the present disclosure may be the same or at least partially different.

As shown in FIG. 8 and FIG. 9, the connection wiring 40 corresponding to the j-th signal output terminal group provided in the embodiment of the present disclosure may be located between the plurality of signal input terminals 32 and the first side of the signal terminal column. The connection wiring 40 corresponding to the (j+1)-th signal output terminal group may be located between the plurality of signal input terminals 32 and the second side of the signal terminal column. Through unifying the directions and positions of the connection wirings 40 connected to different signal output terminal groups, the layout of the wirings may be facilitated.

In one embodiment of the present disclosure, the connection wirings 40 provided by the present disclosure may be transparent connecting wirings to prevent the connection wirings 40 from affecting the light transmittance of the display light-transmitting area A11. In one embodiment, the material of the transparent connection wirings 40 provided by the present disclosure may be indium tin oxide or the like.

Figure 10:
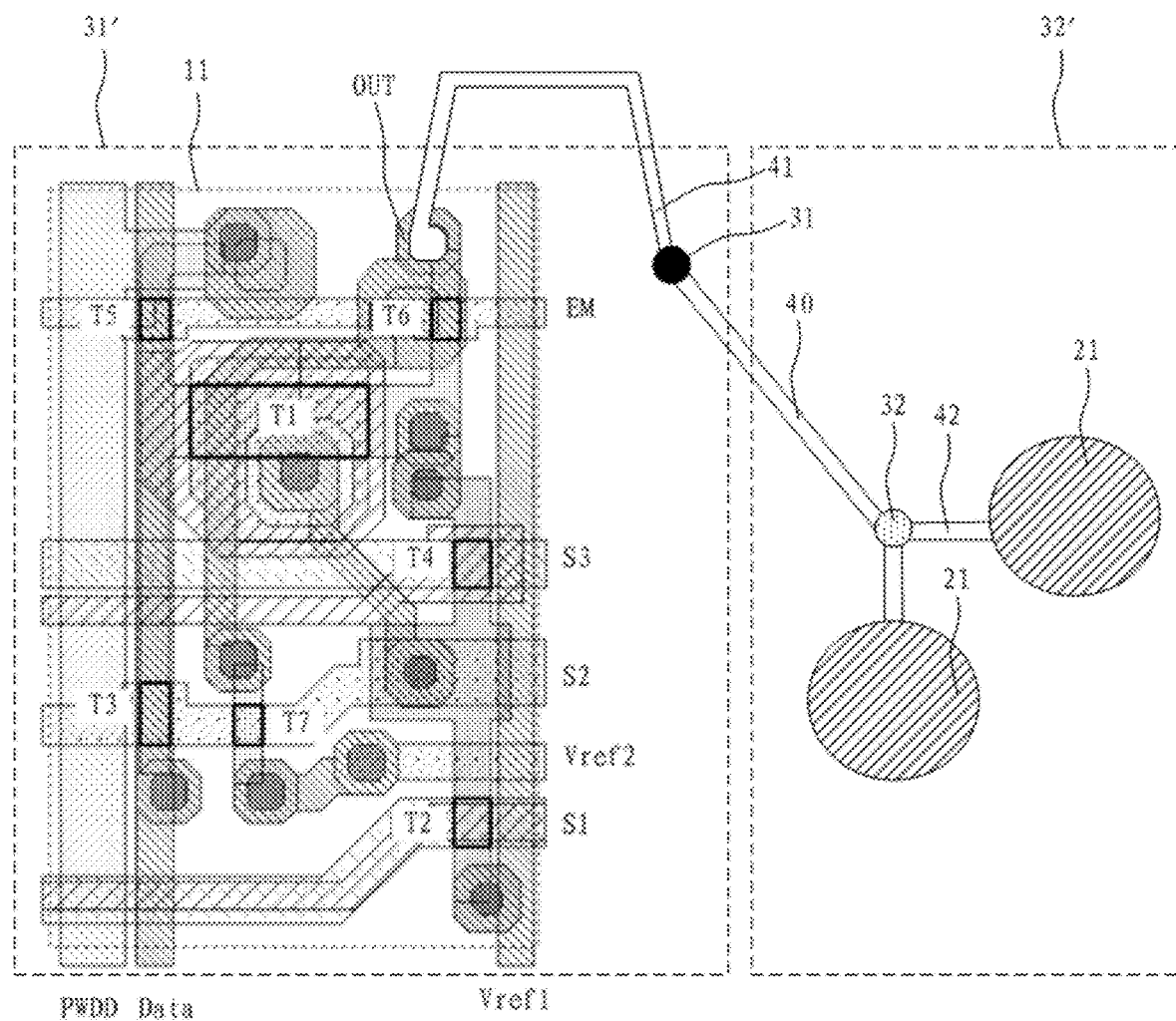
FIG. 10 illustrates an exemplary connection manner of the first driving circuit and the first light-emitting element according to various disclosed embodiments of the present disclosure.
Figure 11:
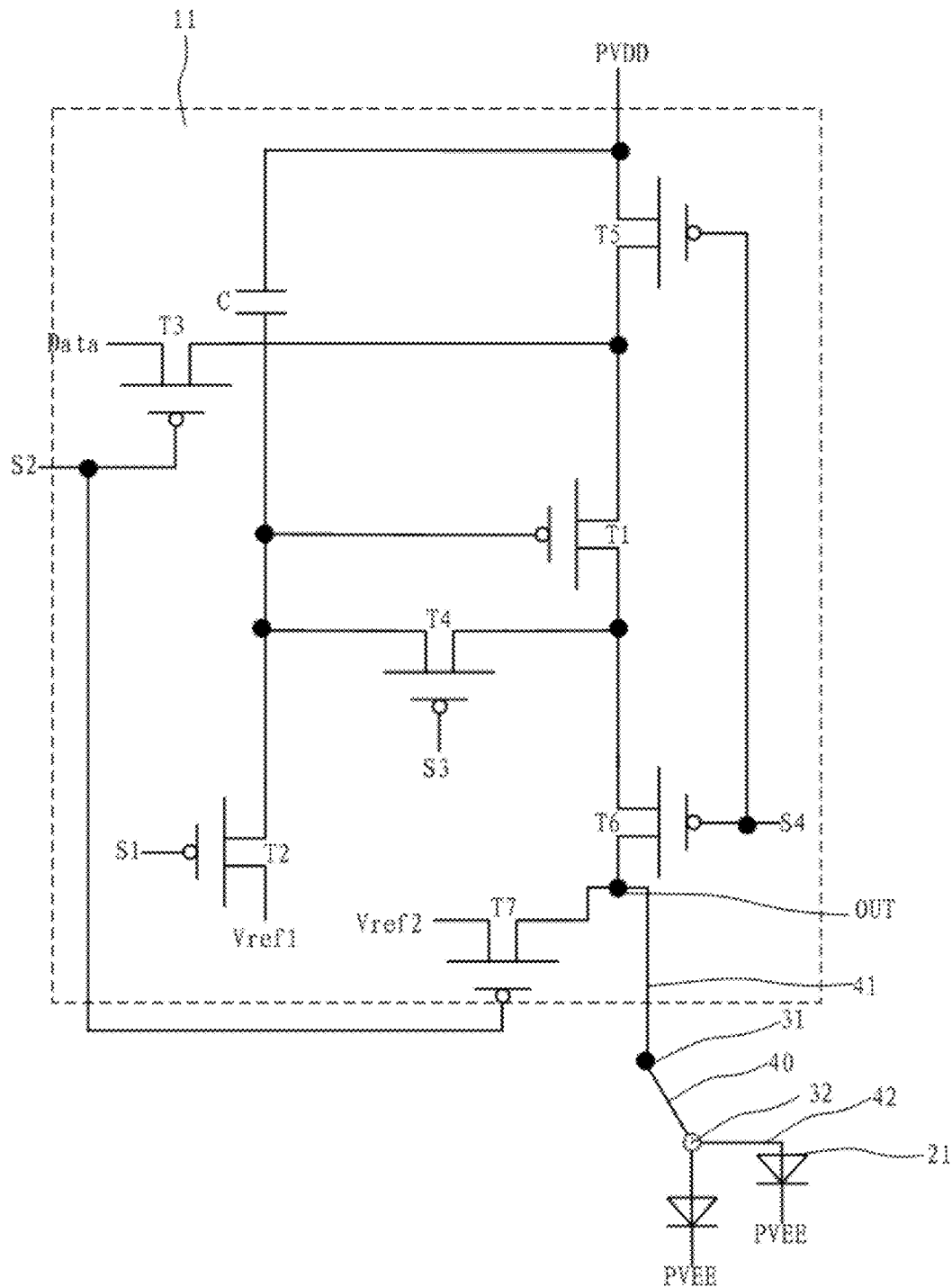
FIG. 11 illustrates an exemplary equivalent circuit of FIG. 10.

FIG. 10 is a schematic structural diagram of a first pixel driving circuit and a first light-emitting element being electrically connected according to an embodiment of the present disclosure, and FIG. 11 is an equivalent circuit diagram of the structural diagram shown in FIG. 10. The first pixel driving circuit 11 provided in the embodiment of the present disclosure may be a 7T1C circuit, for example, it may include a first transistor T1 to a seventh transistor T7 and a storage capacitor C. The connection relationship of the first transistor T1 to the seventh transistor T7 may be sufficient for the description. The first transistor T1 may be a driving transistor for generating a driving current, the second transistor T2 may be configured for transmitting the reset voltage Vref1 to perform the reset processing on the driving transistor, and the third transistor T3 may be configured for transmitting the data voltage Data, the fourth transistor T4 may be configured to compensate the threshold voltage of the first transistor T1, the fifth transistor T5 and the sixth transistor T6 may be configured to output the driving current to the light-emitting element, and the seventh transistor T7 may be configured to transmit the auxiliary reset signal Vref2 to reset the light-emitting element, which is not repeated in the present disclosure. The output terminal OUT of the first pixel driving circuit 11 may be connected to the signal output terminal 31 through the signal output wiring 41, the signal output terminal 31 may be connected to the signal input terminal 32 through the connection wiring 40, and the signal input terminal 32 may be connected to the first light-emitting element 21 through a signal input wiring 42.

It should be noted that FIG. 10 and FIG. 11 provided in the embodiments of the present disclosure only show one type of circuit applicable to of all pixel driving circuits in the present disclosure. In other embodiments of the present disclosure, the pixel driving circuits may also be circuits with other numbers of transistors and with other numbers of capacitors, such as 7T2C, 8T1C, or 8T2C, etc., which are not specifically limited in the present disclosure. Also, at least some of the transistors in the pixel circuit provided by the embodiments of the present disclosure may be single-gate transistors or dual-gate transistors, which are not specifically limited by the present invention.

As shown in FIG. 10, the terminal area provided by the embodiment of the present disclosure may be used to define the positions of the signal output terminal 31 and the signal input terminal 32. The relationship between the output area 31 and the first pixel driving circuit 11 and the relationship between the input area 32' and the first light-emitting element 21 may be not specifically limited. The output area 31' including the signal output terminal 31 may overlap with the area where the corresponding first pixel driving circuit 11 is located (as shown in FIG. 10) or be separated from each other, and the input area 32' including the signal input terminal 32 may overlap with the area where the corresponding first light-emitting element 21 is located (as shown in FIG. 10) or be separated from each other, which is not specifically limited in the present invention.

The following describes the output terminal OUT, the signal output terminal 31, the signal output wiring 41, the signal input terminal 32, the signal input wiring 42, etc. provided by the embodiment of the present disclosure with reference to the cross-sectional drawings of the display panel, etc., abd with the reference of the simple layout shown in FIG. 10 in detail. In one embodiment of the present disclosure, the connection wirings provided by the present disclosure may be located between the planarization layer and the light-emitting element layer.

Figure 12:
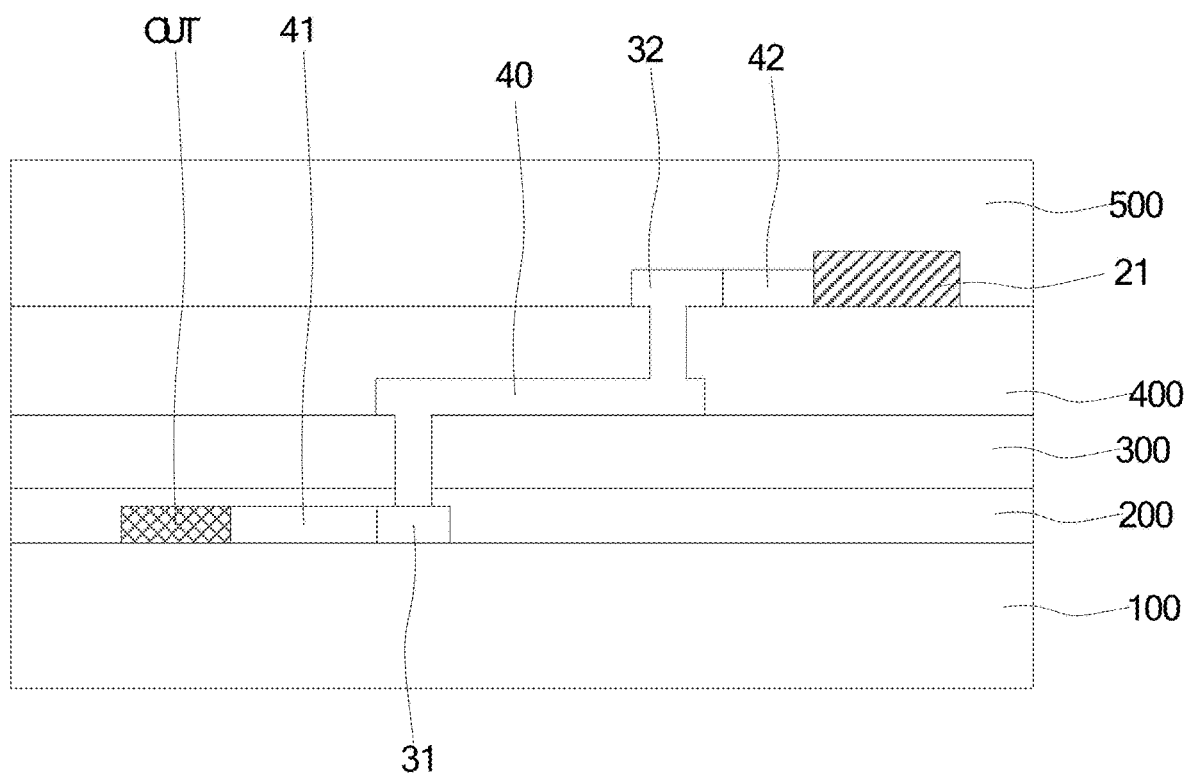
FIG. 12 illustrates another exemplary display panel according to various disclosed embodiments of the present disclosure.

FIG. 12 is a schematic structural diagram of another exemplary display panel provided by an embodiment of the present disclosure. As shown in FIG. 12, the display panel provided by the present disclosure may include a substrate 100, a transistor array layer 200, a planarization layer 300, and a connection layer 400 and a light-emitting element layer 500. The transistor array layer 200 may be located between the substrate 100 and the planarization layer 300. The transistor array layer 200 may include a first pixel driving circuit and a second pixel driving circuit. The connection layer 400 may be located between the planarization layer 300 and the light-emitting element layer. The connection layer 400 may include the connection wirings 40. The output terminal OUT of the first pixel driving circuit may be connected to the signal output terminal 31 through the signal output wiring 41, and the signal output terminal 31 may be connected to the signal input terminal 32 through the connection wiring 40. The light-emitting element layer 500 may include a first light-emitting element 21 and a second light-emitting element. The signal input terminal 32 may be connected to the first light-emitting element 21 through the signal input wiring 42.

In one embodiment of the present disclosure, the substrate may be a rigid substrate, such as a glass substrate, etc.; or, the substrate may be a flexible substrate, such as a polyimide substrate, etc., meeting the requirements of folding, etc. In another embodiment, the substrate may also be a design in which some areas are rigid substrates, and some areas are flexible substrates to meet the requirements of folding in more ways, which is not specifically limited by the present disclosure. The transistor array layer may be formed with components and circuits, such as transistors and capacitors, etc. These components form a scanning circuit, and a pixel driving circuit, etc. The scanning circuit may provide corresponding scanning signals for the pixel driving circuit, and then the pixel driving circuit may generate a driving current according to the scanning signal, and the light-emitting element may be lighted up in response to the driving current. The planarization layer may provide a flatter surface, which may facilitate for the preparation of subsequent circuits, light-emitting elements and other devices. The planarization layer may be made of organic materials, such as polymethacrylate, polysiloxane, epoxy resin, etc., and is not specifically limited in the present disclosure. Further, the light-emitting element layer may include a light-emitting element, and the light-emitting element may be formed by stacking an anode, a light-emitting layer and a cathode, which is not redundantly described in the present disclosure.

Figure 13:
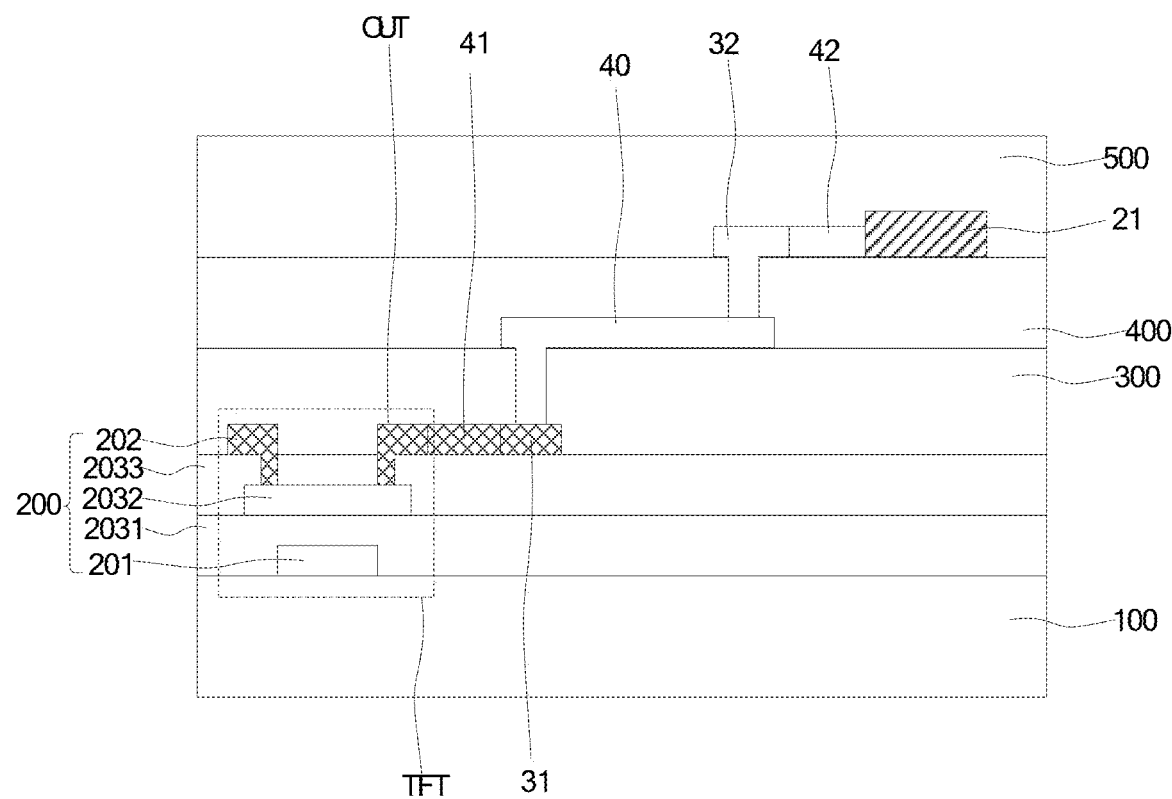
FIG. 13 illustrates another exemplary display panel according to various disclosed embodiments of the present disclosure.

FIG. 13 is a schematic structural diagram of another exemplary display panel provided by an embodiment of the present disclosure. As shown in FIG. 13, the transistor array layer 200 provided by the present disclosure may include a gate metal layer 201 and a source/drain metal layer 202 located between the gate metal layer 201 and the planarization layer 300. The signal output terminal 32 may be electrically connected to the output terminal of the first pixel driving circuit 11 through a signal output wiring 41. One of the signal output terminal 31 and the signal output wiring 41 may be located at the gate metal layer 201 or the source/drain metal layer 202.

As shown in FIG. 13, the transistor TFT in the transistor array layer 200 provided by the embodiment of the present disclosure may be a bottom-gate transistor, and the gate metal layer 201 may include the gate of the transistor TFT. The transistor array layer 200 may also include a gate insulation layer 2031 located on the side of the gate metal layer 201 facing the light-emitting element layer 500, and a semiconductor layer 2032 located on the side of the gate insulation layer 2031 facing the light-emitting element layer 500. The semiconductor layer 2032 may include an active region of the transistor TFT. The transistor array layer 200 may also include an interlayer insulation layer 2033 on the side of the semiconductor layer 2032 facing the light-emitting element layer 500 and the source/drain metal layer 202 on the side of the interlayer insulation layer 2303 facing the light-emitting element layer 500. The source/drain metal layer 202 may include the source and the drain electrodes of the transistor TFT. The output terminal OUT of the first pixel driving circuit may be the source or the drain of the corresponding transistor TFT in the transistor array layer 200.

Figure 14:
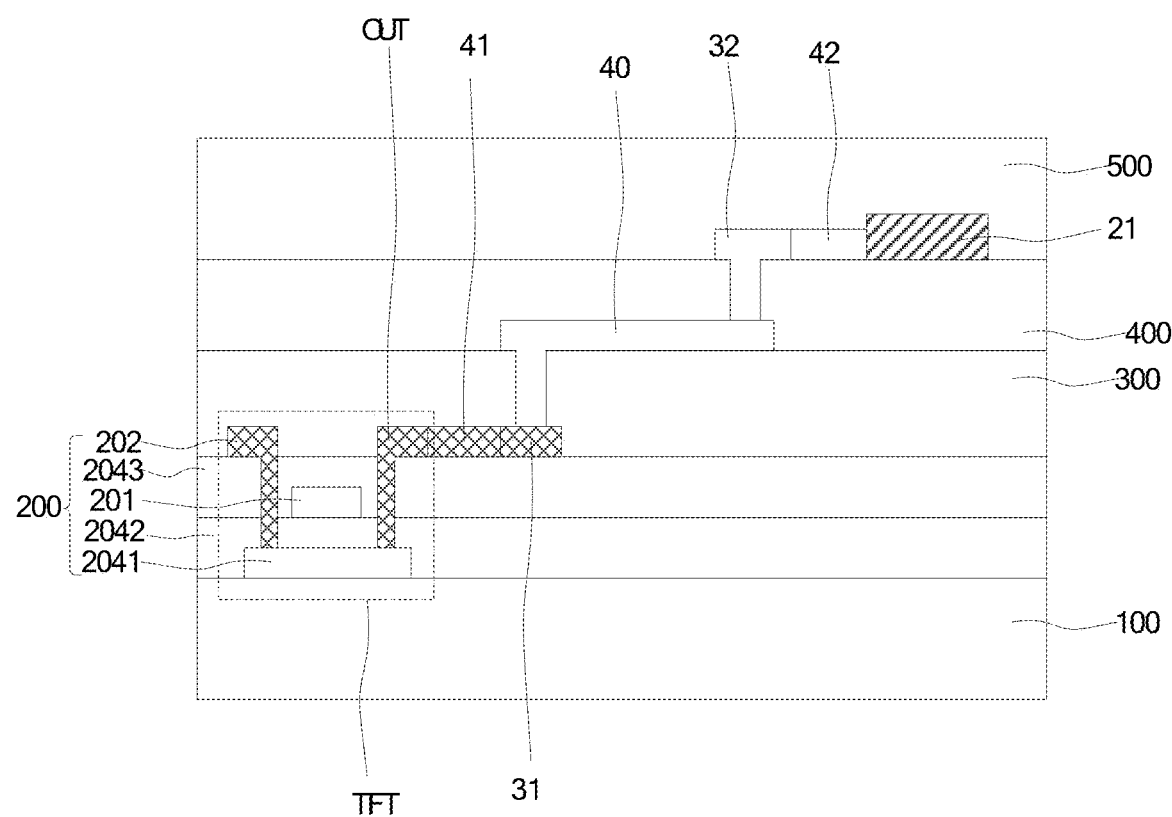
FIG. 14 illustrates another exemplary display panel according to various disclosed embodiments of the present disclosure.

In one embodiment of the present disclosure, the transistors in the transistor array layer provided by the present disclosure may also be top-gate transistors. FIG. 14 is a schematic structural diagram of another exemplary display panel provided by an embodiment of the present disclosure. As shown in FIG. 14, the transistor array layer 200 may include a semiconductor layer 2041, and the semiconductor layer 2041 may include the active area of the transistor TFT. The transistor array layer 200 may also include a first insulation layer 2042 on the side of semiconductor layer 2041 facing the light-emitting element layer 500, and a gate metal layer 201 on the side of the first insulation layer 2042 facing the light-emitting element layer 500. The gate metal layer 201 may include the gate of the transistor TFT. The transistor array layer 200 may also include a second insulation layer 2043 on the side of the gate metal layer 201 facing the light-emitting element 500; and the source/drain metal layer 202 on the side of the second insulation layer 2043 facing the light-emitting element layer 500. The source/drain metal layer 202 may include the source and drain electrodes of the transistor TFT.

As shown in FIGS. 13-14, the signal output terminal 31 and the signal output wiring 41 provided in this embodiment of the present disclosure may be in the same layer and both may be located in the source/drain metal layer 202. In other embodiments of the present disclosure, the signal output terminal 31 and the signal output wiring 41 may also be located in different layers, for example, one may be located in the gate metal layer, and the other may be located in the source/drain metal layer.

In one embodiment of the present disclosure, the transistor array layer may further include a transition metal layer between the source/drain metal layer and the planarization layer, and the transition metal layer may be used to form wires and plates of capacitors. The following description will be given by taking a transistor array layer in which the transistor is a bottom gate type as an example.

Figure 15:
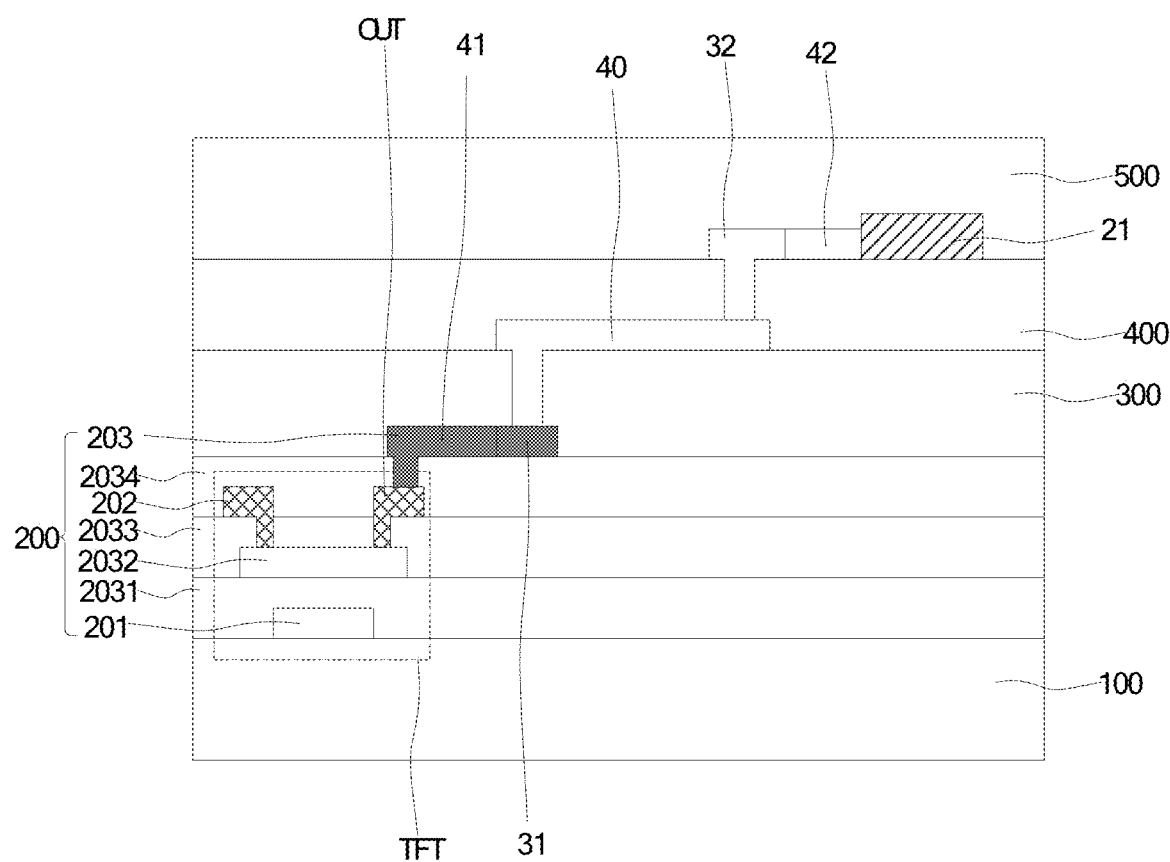
FIG. 15 illustrates another exemplary display panel according to various disclosed embodiments of the present disclosure.

FIG. 15 is a schematic structural diagram of another exemplary display panel provided by an embodiment of the present disclosure. As shown in FIG. 15, the transistor array layer 200 may include a gate metal layer 201 located between the gate metal layer 201 and the planarization layer 500, a source/drain metal layer 202 disposed between the gate metal layer 201 and the planarization layer 500, and a transition metal layer 203 disposed between the source/drain metal layer 202 and the planarization layer 500. The signal output terminal 31 may be electrically connected to the output terminal OUT of the first pixel driving circuit through a signal output wiring 41. One of the signal output terminal 31 and the signal output wiring 41 may be located at the gate metal layer 201, or the source/drain metal layer 202 or the transition metal layer 203. A third insulation layer 2034 may be located between the source/drain metal layer 202 and the transition metal layer 203. The arrangement of the transition metal layer 203 may further increase the wiring space of the display panel. Accordingly, by optimizing the wiring, the overlapping phenomenon between the light-emitting element and the wiring of different layers and among the wirings of different layers may be reduced, and the capacitive coupling problem of the circuit may be reduced. At the same time, it may also facilitate the planning and design of signal output terminals, signal output wirings and other wirings.

Figure 16:
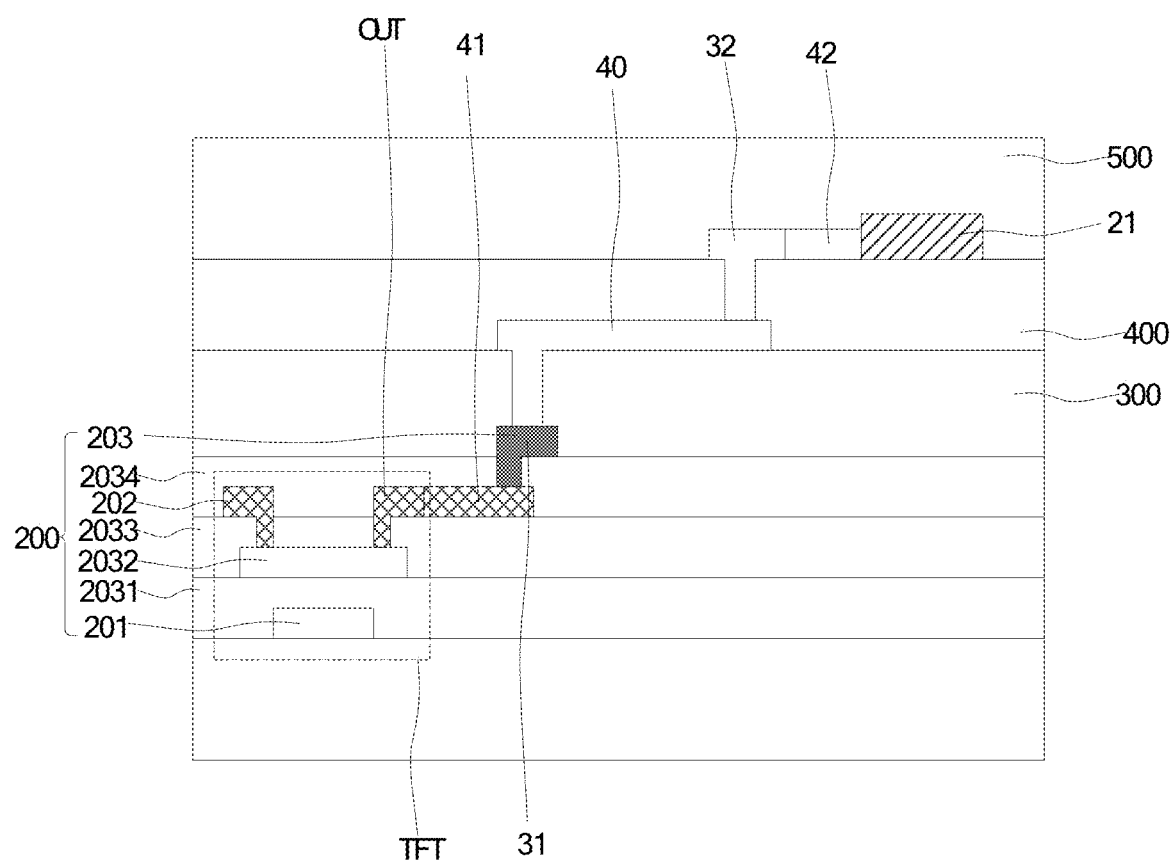
FIG. 16 illustrates another exemplary display panel according to various disclosed embodiments of the present disclosure.

As shown in FIG. 15, the signal output terminal 31 and the signal output wiring 41 provided in the embodiment of the present disclosure may be on the same layer and may be located in the transition metal layer 203. The signal output wiring 41 may be electrically connected to the output terminal OUT of the first driving circuit through the via hole. In another embodiment, as shown in FIG. 16, the signal output terminal 31 and the signal output wiring 41 may be arranged in different layers. The signal output terminal 31 may be located at the transition metal layer 203, and the signal output wiring 41 may be located at the source/drain metal layer 202. The signal output wiring 41 may be connected to the output terminal OUT of the first pixel driving circuit on the same layer, and the signal output wire 41 may be electrically connected to the signal output terminal 31 through a via hole. Alternatively, in other embodiments of the present disclosure, the signal output wiring 41 and the signal output terminal 31 may also be disposed in the same layer or different layers, for example, in the gate metal layer, in the source/drain metal layer or in the transition metal layer which is not specifically limited in the present disclosure.

In any of the above embodiments of the present disclosure, the output terminal of the first pixel driving circuit, the signal output terminal and the signal output wiring may be located on the same layer, and the signal output wiring and the output terminal of the first pixel driving circuit and the signal output terminal may be connected in the same layer. As shown in FIG. 13, the output terminal OUT, the signal output terminal 31 and the signal output wiring 41 may all be disposed on the same layer, and the signal output wiring 41, the output terminal OUT and the signal output terminal 31 may be connected in the same layer. In other embodiment, at least one of the output terminal, the signal output terminal, and the signal output wiring may be disposed in a layer different from the rest, and the signal output wiring may be connected to the rest structures through a via hole. As shown in FIG. 16, the output terminal OUT and the signal output wiring 41 may be located on the same layer, and the signal output terminal 31 may be located in the transition metal layer 203. The output terminal OUT may be connected to the signal output wiring 41 on the same layer, and the signal output wiring 41 may be connected to the signal output terminal 31 through a via hole.

It should be noted that FIG. 13 to FIG. 16 provided in the embodiments of the present disclosure are only a few of all wiring relationships applicable to the output terminal OUT, the signal output terminal 31 and the signal output wiring 41, and the present disclosure is not limited to the wiring relationships from FIG. 13 to FIG. 16.

Figure 17:
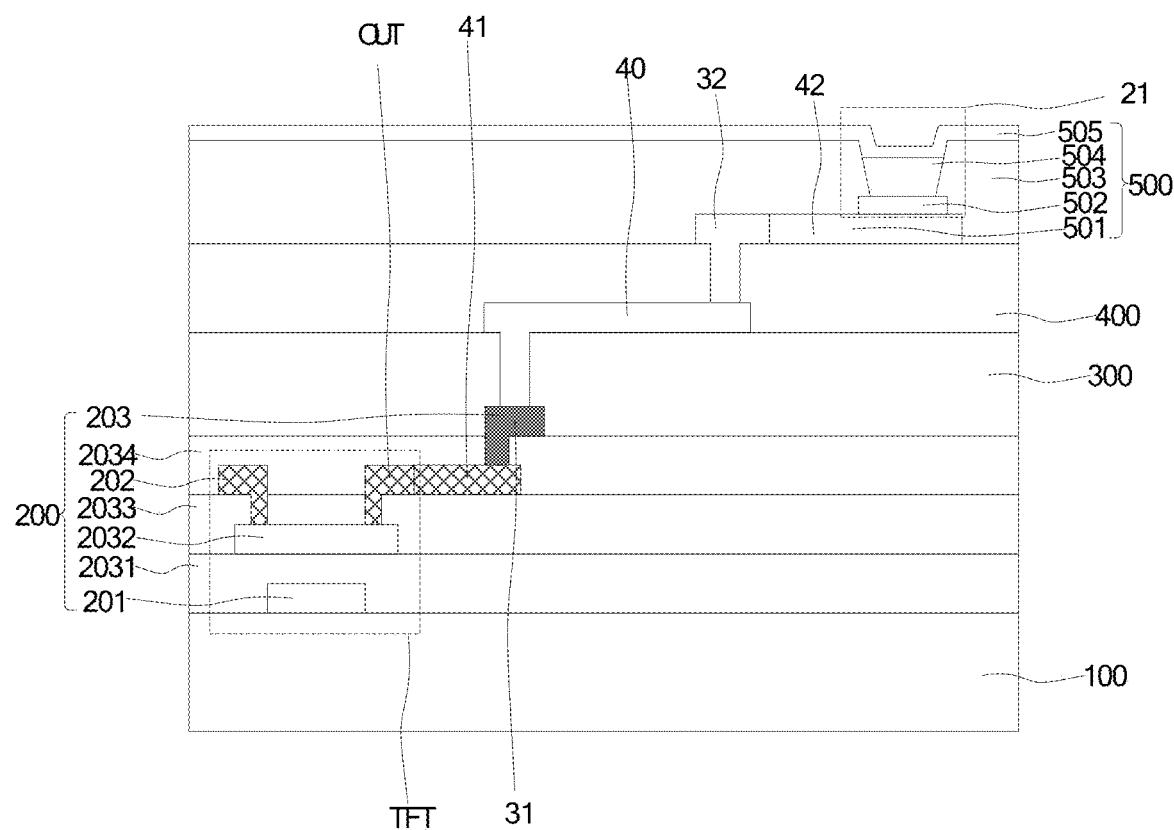
FIG. 17 illustrates another exemplary display panel according to various disclosed embodiments of the present disclosure.

FIG. 17 is a schematic structural diagram of another exemplary display panel provided by an embodiment of the present disclosure. As shown in FIG. 17, the signal input terminal 32 may be connected to at least one of the first light-emitting elements 21 through a signal input wiring 42. The light-emitting element layer 500 may include an auxiliary conductive layer 501, an anode layer 502, a pixel definition layer 503, a light-emitting layer 504 and a cathode 505. The auxiliary conductive layer 501 may include a plurality of signal input terminals 32 and a signal input wiring 42. The anode layer 502 may be located between the auxiliary conductive layer 501 and the pixel definition layer 503. The anode layer 502 may include a plurality of anodes. The signal input wiring 42 may be connected to an anode of at least one of the first light-emitting elements 21. The pixel definition layer 503 may include a hollowed portion corresponding to the anode. The pixel definition layer 503 may define the position of the light-emitting element through the hollowed portion. The material of the pixel definition layer 503 may be an organic material or inorganic materials, which may need to be selected according to actual applications. The light-emitting layer 504 may be located between the anode and the cathode 505 and located in the hollowed portion. In one embodiment, the anode may be made of Ag, which may ensure a high reflectivity of the anode and improve the light extraction efficiency of the light-emitting element.

In one embodiment of the present disclosure, the light-emitting element may be an organic light-emitting element. In other embodiments of the present disclosure, the light-emitting element may also be micro-LED or mini-LED, etc., which is not specifically limited to the present disclosure.

As shown in FIG. 17, the anode layer 502 provided in the embodiment of the present disclosure may be a single-layer metal structure. The anode layer 502 provided in the embodiment of the present disclosure may also be a super-imposed structure of a plurality of conductive structures to improve the performance of the anode.

Figure 18:
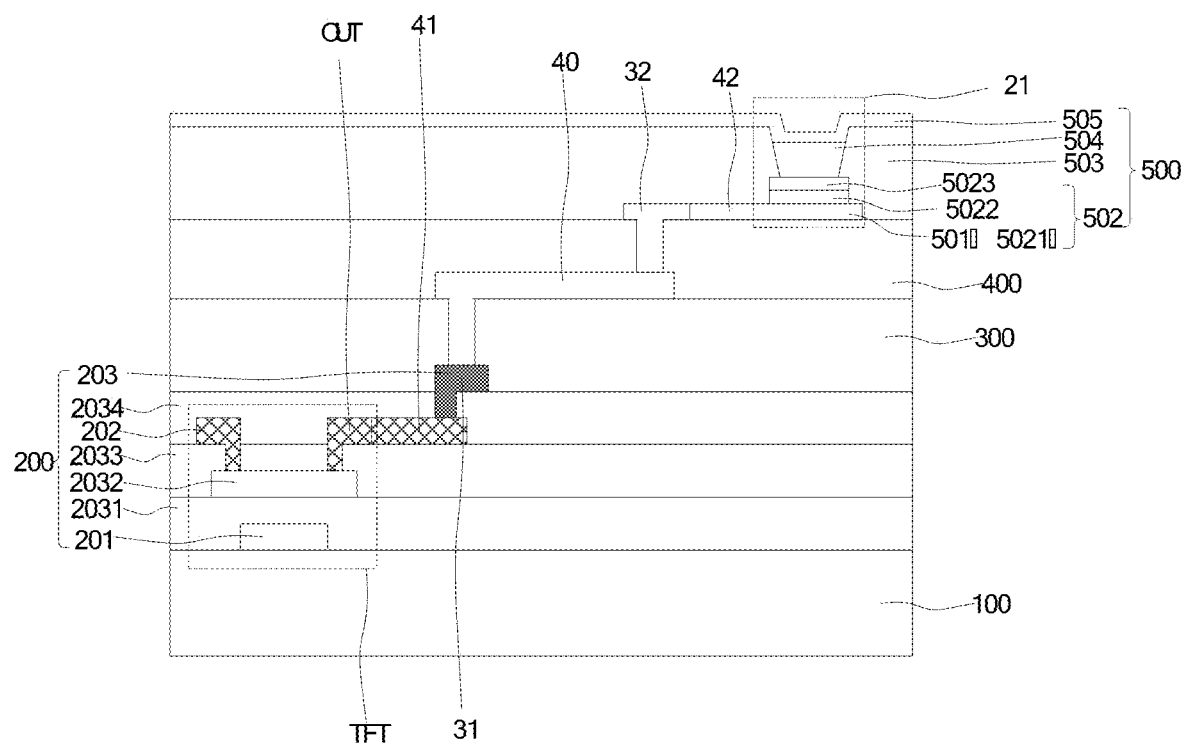
FIG. 18 illustrates another exemplary display panel according to various disclosed embodiments of the present disclosure.

FIG. 18 is the schematic structure of another exemplary display panel provided in the embodiment of the present disclosure. As shown in FIG. 18, the signal input terminal 32 may be connected to at least one of the first light-emitting elements 21 through the signal input wiring 42. The light-emitting element layer 500 may include an auxiliary conductive layer 501, an anode layer 502, and a pixel definition layer 503, a light-emitting layer 504 and a cathode 505. The auxiliary conductive layer 501 may include a plurality of signal input terminals 32 and the signal input wiring 42. The anode layer 502 may include a plurality of anodes, and the anode may include a first sub-conductive layer 5021, a metal layer 5022 and a second sub-conductive layer 5023 sequentially stacked together. The auxiliary conductive layer 501 may be disposed in the same layer as the first sub-conductive layer 5021 and/or the second sub-conductive layer 5023. The signal input wiring 42 may be connected to the anode of at least one first light-emitting element 21 through the signal input wiring 42. The pixel definition layer 503 may be located between the cathode 505 and the anode layer 502, and the pixel definition layer 503 may include a hollowed portion corresponding to the anode. The light-emitting layer 503 may be located between the anode and the cathode 505 and located in the hollowed portion. In one embodiment, the metal layer may be an Ag metal layer, thereby ensuring a higher reflectivity of the anode and improving the light extraction efficiency of the light-emitting element.

In one embodiment, the auxiliary conductive layer 501 may be a transparent layer, which may avoid affecting the light transmittance of the display light-transmitting area. The first sub-conductive layer 5021 and the second sub-conductive layer 5023 may also be transparent layers. The transparent material of the auxiliary conductive layer 501, the first sub-conductive layer 5021 and the second sub-conductive layer 5023 may be indium tin oxide, etc. The auxiliary conductive layer 501 may multiplex the first sub-conductive layer 5021 and/or the second sub-conductive layer 5023. For example, one of the signal input wiring 42 and the signal input terminal 32 may be located on the first sub-conductive layer 5021 or the second sub-conductive layer 5022, thereby reducing the preparation of film layers.

Figure 19:
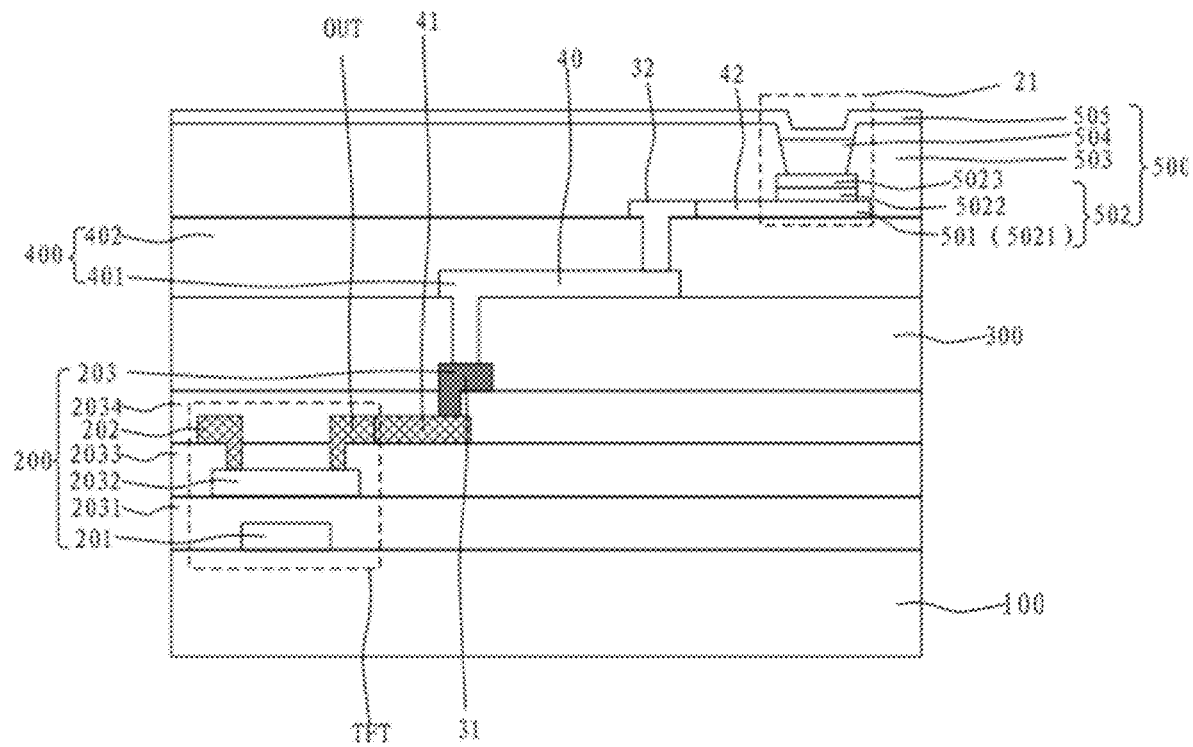
FIG. 19 illustrates another exemplary display panel according to various disclosed embodiments of the present disclosure.

FIG. 19 is a schematic structural diagram of another exemplary display panel provided by an embodiment of the present disclosure. As shown in FIG. 19, the connection layer 400 may include a transparent conductive layer 401, and the transparent conductive layer 401 may include the connection wiring 40. A corresponding isolation insulation layer 402 may be included between the transparent conductive layer 401 and the auxiliary conductive layer 501. The thickness of the isolation insulation layer 402 provided by the embodiment of the present disclosure may be in a range of approximately 0.5 μm-1.5 μm, thereby improving the problem of wiring capacitive coupling between the transparent conductive layer 401 and the auxiliary conductive layer 501.

In one embodiment of the present disclosure, the connection layer 400 may include a single conductive layer. In another embodiment, the connection layer 400 may further include a plurality of conductive layers to improve wiring space.

Figure 20:
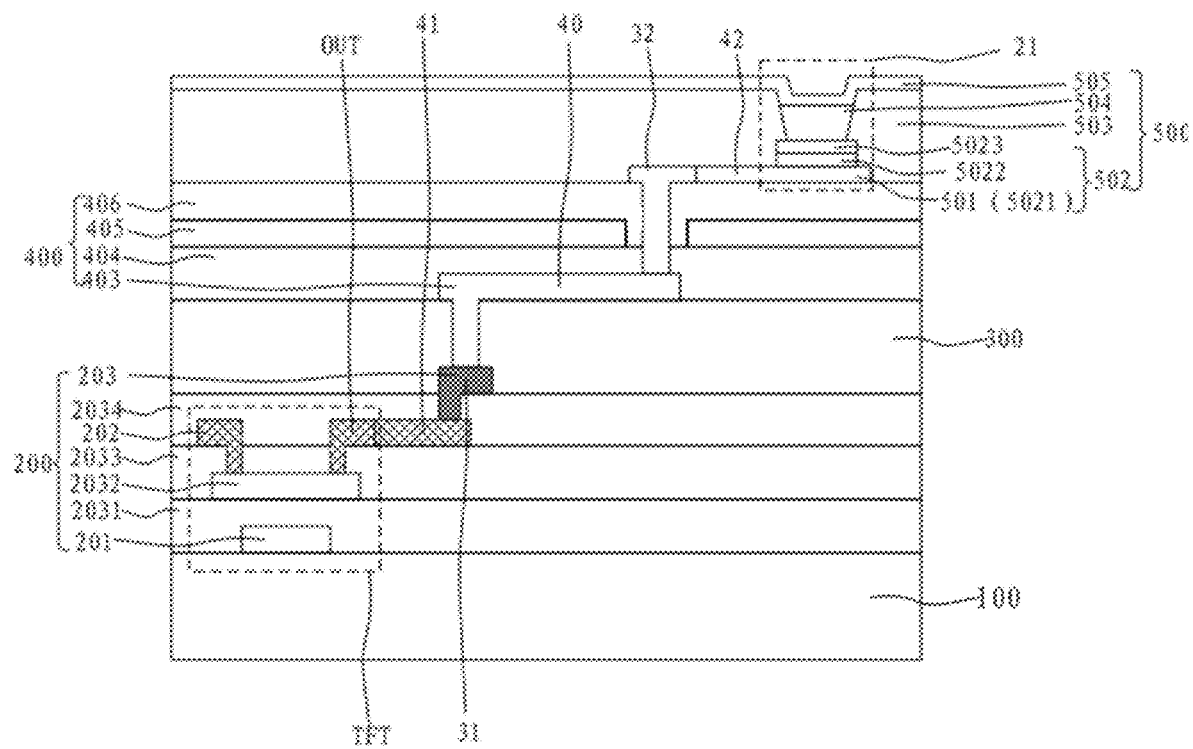
FIG. 20 illustrates another exemplary display panel according to various disclosed embodiments of the present disclosure.

FIG. 20 is a schematic structural diagram of another exemplary display panel provided by an embodiment of the present disclosure. As shown in FIG. 20, the connection layer 400 may include a first transparent conductive layer 403, an insulation layer 404 and a second transparent conductive layer 405. The first transparent conductive layer 403 may be located between the insulation layer 404 and the substrate 100, and the insulation layer 404 may be located between the first transparent conductive layer 403 and the second transparent conductive layer 405. The connection layer 400 may include an auxiliary insulation layer 406 located between the auxiliary conductive layer 501 and the second transparent conductive layer 405. The plurality of connection wirings 40 provided in the embodiment of the present disclosure may all be located in the first transparent conductive layer 403 or the second transparent conductive layer 405. In some embodiments, some of the plurality of connection wirings 40 may be located in the first transparent conductive layer 403, and other of the plurality of connection wirings 40 may be located in the second transparent conductive layer 405, which is not specifically limited in the present disclosure.

In one embodiment, the thickness range of the insulation layer 404 and the auxiliary insulation layer 406 may be in range of approximately 0.5 μm-1.5 μm, which may further reduce the capacitive coupling between the lines of the conductive layers at both sides of the insulation layer.

Figure 21:
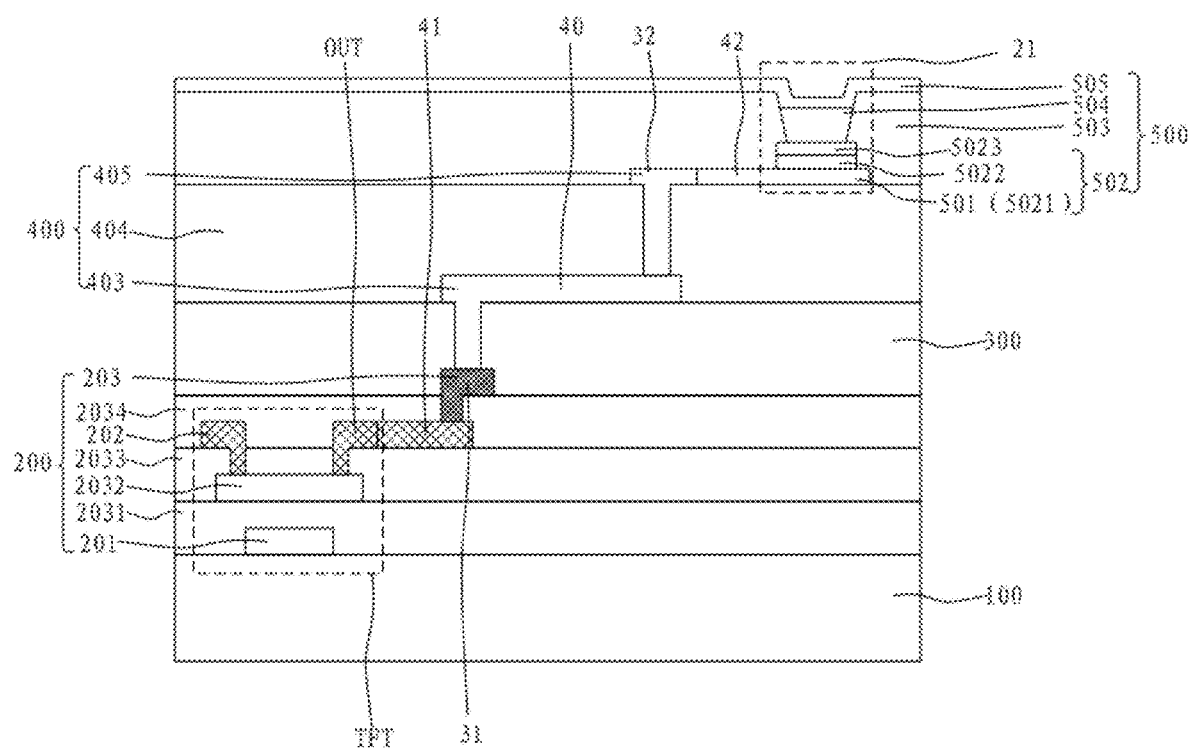
FIG. 21 illustrates another exemplary display panel according to various disclosed embodiments of the present disclosure.

The auxiliary conductive layer 501 provided in the embodiment of the present disclosure may also be disposed in the same layer as the second transparent conductive layer 405, thereby reducing the preparation of the film layer and the production cost. As shown in FIG. 21, the auxiliary conductive layer 501 and the second transparent conductive layer 405 provided in the embodiment of the present disclosure may be a same layer, thereby reducing the preparation of the film layer and reducing the production cost. Further, the auxiliary layer 501 may also be the same layer as the first sub-conductive layer 5021 and/or the second sub-conductive layer 5023 of the anode, which may further reduce the preparation of film layers. The auxiliary conductive layer 501 provided by the embodiment of the present disclosure may need to prepare the circuit of the signal input wiring 42, thus the plurality of connection wirings 40 provided by the present disclosure may all be located in the first transparent conductive layer 403 to avoid the effect to the wirings between the connection wiring 40 and the signal input wiring 42. In some embodiments, a portion of the plurality of connection wirings 40 may be located in the first transparent conductive layer 403, and others may be located in the second transparent conductive layer 405 such that the wiring space of the first transparent conductive layer 403 and the second transparent conductive layer 405 may be properly used.

The present disclosure further provides a display device. The display device may include the display panel provided in any one of the foregoing embodiments or other appropriate display panel.

Figure 22:
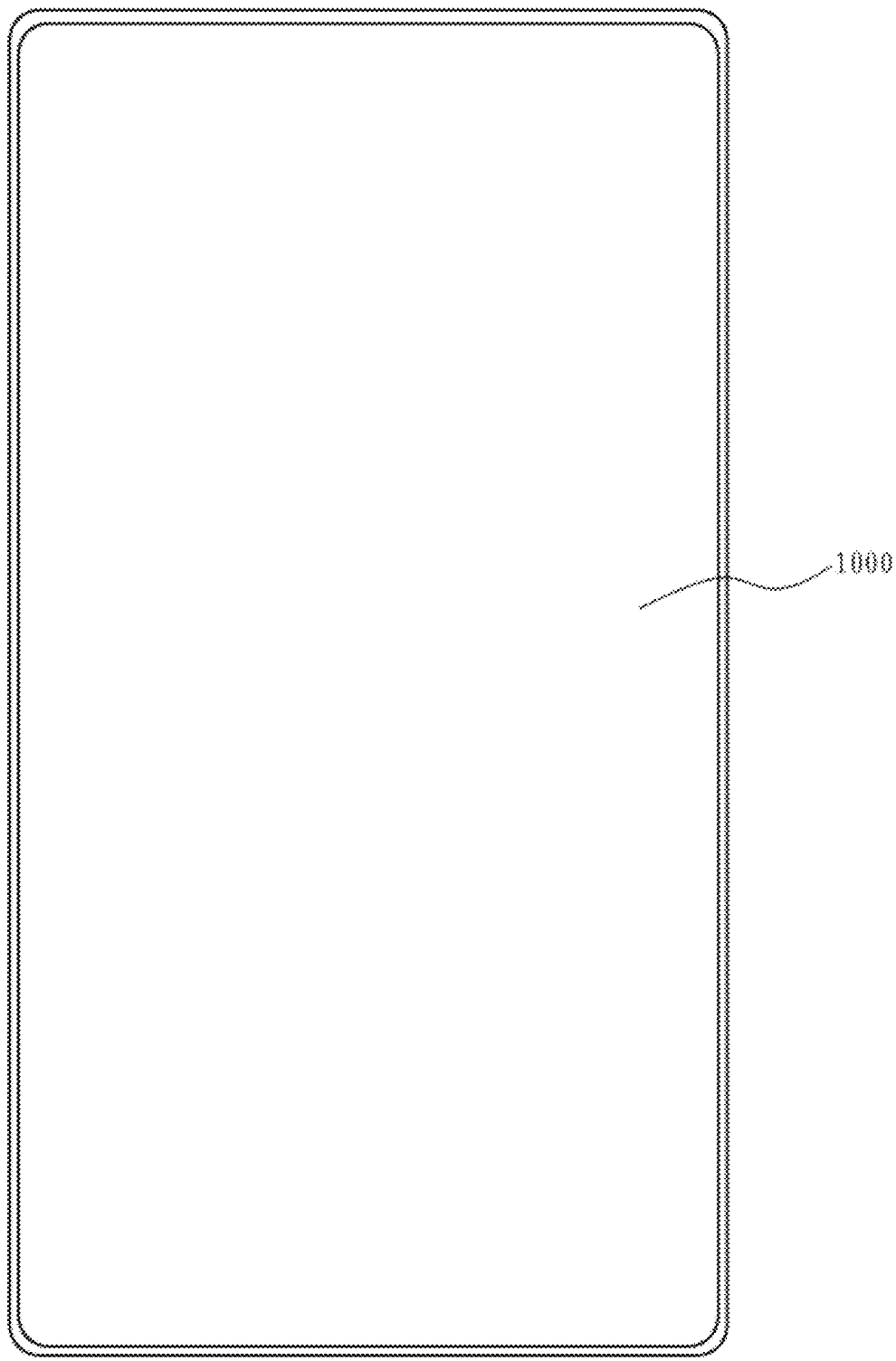
FIG. 22 illustrates an exemplary display device according to various disclosed embodiments of the present disclosure.

FIG. 22 is a schematic structural diagram of a display device provided by an embodiment of the present disclosure. As shown in FIG. 22, the display device 1000 provided by an embodiment of the present disclosure may be a mobile terminal device.

In some embodiments, the display device provided by the present disclosure may also be an electronic display device, such as a computer and a wearable display device, which is not specifically limited by the present disclosure.

In one embodiment of the present disclosure, the display device may include a photosensitive element, and the photosensitive element may be disposed correspondingly to the display light-transmission area. For example, a camera may be disposed on the back of the display panel, and may overlap with the display light-transmission areas of the display panels. In some embodiments, other types of photosensitive elements may also be provided in the display light-transmission area, which may need to be specifically designed according to the type of the display device. The photosensitive element provided by the embodiment of the present disclosure may be disposed to overlap with the display light-transmission area such that the photosensitive element may collect the light transmitted through the display light-transmission area to work; and the display light-transmission area provided by the embodiment of the present disclosure may not be disposed with the first pixel driving circuit at display light-transmission area to further ensure that the light transmittance of the display light-transmission area may be relatively high, and the light-collecting effect of the photosensitive element may be improved.

The present disclosure provides a display panel and a display device. The display panel may include a signal output terminal electrically connected to an output terminal of a first pixel driving circuit and a signal input terminal electrically connected to at least one light-emitting element. The signal output terminal may be connected with the signal input terminal to realize the purpose of driving the first light-emitting element by the first pixel driving circuit. In the technical solution provided by the embodiments of the present disclosure, the signal output terminal and the signal input terminal may be disposed in the display panel, and the arrangement of the signal output terminal and the signal input terminal may be optimally designed to limit the wiring mode of the connection wirings to avoid the occurrence of chaotic wiring and to the automatic wiring. At the same time, it may ensure that the connection lines extend integrally, thereby avoiding the situation that the connection lines extend crosswise and a bridge structure appears at the intersection, thereby reducing the difficulty of forming the lines.

In the description of the present disclosure, it is to be understood that the terms "center", "longitudinal", "lateral", "length", "width", "thickness", "upper", "lower", "front", "back", "left", "right", "vertical", "horizontal", "top", "bottom", "inside", "outside", "clockwise", "counterclockwise", "axial", "radial", or "circumferential", etc., indicate the orientation or positional relationship based on the orientation or positional relationship shown in the accompanying drawings, which are only for the convenience of describing the present disclosure and simplifying the description, rather than indicating or implying the indicated device or elements must have a particular orientation, be constructed and operate in a particular orientation, and therefore should not be construed as limiting the disclosure.

In addition, the terms "first" and "second" appears for descriptive purposes only, and should not be understood as indicating or implying relative importance or implying the number of indicated technical features. Thus, a feature delimited with "first", or "second" may expressly or implicitly include at least one of that feature. In the description of the present disclosure, "plurality" means at least two, such as two, or three, etc., unless otherwise expressly and specifically defined.

In the present disclosure, unless otherwise expressly specified and limited, such terms as "installed", "connected", "connected" and "fixed" should be understood in a broad sense, for example, it may be a fixed connection or it may be disassembled and connected, or integrated; it can be a mechanical connection or an electrical connection or can communicate with each other; it can be directly connected or indirectly connected through an intermediate medium, it can be the internal communication of two elements or the interaction of two elements relationship, unless otherwise expressly qualified. For those of ordinary skill in the art, the specific meanings of the above terms in the present disclosure can be understood according to specific situations.

In the present disclosure, unless otherwise expressly specified and limited, a first feature "on" or "under" a second feature may be in direct contact between the first and second features, or the first and second features indirectly through an intermediary touch. Also, the first feature being "above", "over" and "on top of" the second feature may mean that the first feature is directly above or obliquely above the second feature, or simply means that the first feature is level higher than the second feature. The first feature being "below", "under" and "beneath" the second feature may mean that the first feature is directly or obliquely below the second feature, or simply means that the first feature has a lower level than the second feature.

In the present disclosure, when the terms "one embodiment", "some embodiments", "example", "specific example", or "some examples" etc. appear, they may mean the specific features, structures, structures, a material or feature may be included in at least one embodiment or example of the disclosure. In this disclosure, schematic representations of these terms are not necessarily directed to the same embodiment or example. Furthermore, the particular features, structures, materials or characteristics described may be combined in any suitable manner in any one or more embodiments or examples. Furthermore, those skilled in the art may combine and combine the different embodiments or examples described in this specification, as well as the features of the different embodiments or examples, without conflicting each other.

Although the embodiments of the present disclosure have been shown and described above, it should be understood that the above embodiments are exemplary and should not be construed as limiting the present disclosure. The above description of the disclosed embodiments enables any person skilled in the art to make or use the present disclosure. Various modifications to these embodiments will be readily apparent to those skilled in the art, and the generic principles defined herein may be implemented in other embodiments without departing from the spirit or scope of the present application. Therefore, this disclosure is not intended to be limited to the embodiments shown herein, but is to be accorded the widest scope consistent with the principles and novel features disclosed herein.

What is claimed is:

1. A display panel, comprising:
   a first display area; and
   a second display area,
   wherein:
   the first display area includes a display light-transmission area and a display transition area and, in a first direction, the display transition area includes a sub-display transition area located at at least one side of the display light-transmission area;
   the first display area includes a plurality of first pixel driving circuits and a plurality of first light-emitting elements, and the plurality of first pixel driving circuits are all located in the display transition area;
   in the display light-transmission area to the sub-display transition area, the first display area further includes a plurality of signal terminal columns arranged in a second direction, and a signal terminal column of the plurality of signal terminal columns includes a plurality of signal output terminals arranged in the first direction and a plurality of signal input terminals arranged in the first direction, the first direction and the second direction are parallel to a plane where the display panel is located, and the first direction intersects the second direction; and
   the first display area further includes a plurality of connection wirings extending integrally in the first direction, a signal output terminal of the plurality of signal output terminals is electrically connected with an output terminal of a first pixel driving circuit of the plurality of first pixel driving circuits, and a signal input terminal of the plurality signal input terminals is electrically connected to at least one first light-emitting element of the plurality of first light-emitting elements, and the signal output terminal and the signal input terminal are electrically connected through a connection wiring of the plurality of connection wirings.

2. The display panel according to claim 1, wherein:
   in the signal terminal column, the plurality of signal output terminals includes a first signal output terminal to an N-th signal output terminal arranged in sequence in the first direction;
   the plurality of signal input terminals includes a first signal input terminal to an N-th signal input terminal arranged in sequence in the first direction;
   an arrangement direction of the first signal output terminal to the N-th signal output terminal is same as an arrangement direction of the first signal input terminal to the N-th signal input terminal;
   an i-th signal output terminal and an i-th signal input terminal are electrically connected through a connection wiring of the plurality of connection wirings;
   N is an integer not less than 2; and
   i is a positive integer not greater than N.

3. The display panel according to claim 1, wherein:
   in the signal terminal column, the plurality of signal output terminals are located at a first side of the signal terminal column in the second direction and the plurality of signal input terminals are located at a second side of the signal terminal column in the second direction; and
   the first side of the signal terminal column and the second side of the signal terminal column are two opposing sides of the signal terminal column in the second direction.

4. The display panel according to claim 1, wherein:
   in the signal terminal column, the plurality of signal input terminals are sequentially divided into a first signal input terminal group to an M-th signal input terminal group in the first direction, and a signal input terminal group includes at least one signal input terminal of the plurality of signal input terminals;
   a j-th signal input terminal group is located at a first side of the signal terminal column in the second direction;
   a (j+1)-th signal input terminal group is located at a second side of the signal terminal column in the second direction;
   the first side of the signal terminal column and the second side of the signal terminal column are two opposing sides of the signal terminal column in the second direction;
   M is an integer not less than 2;
   j is a positive integer less than M; and
   the plurality of signal output terminals are located between the first side of the signal terminal column and the second side of the signal terminal column.

5. The display panel according to claim 4, wherein:
connection wirings corresponding to the j-th signal input terminal group are located between the plurality of signal output terminals and the first side of the signal terminal column; and
connection wirings corresponding to the (j+1)-th signal input terminal group are located between the plurality of signal output terminals and the second side of the signal terminal column.

6. The display panel according to claim 4, wherein:
numbers of signal input terminals included in different signal input terminal groups are same.

7. The display panel according to claim 1, wherein:
in the signal terminal column, the plurality of signal output terminals are sequentially divided into a first signal output terminal group to an M-th signal output terminal group in the first direction, and a signal output terminal group includes at least one signal output terminal of the plurality of signal output terminals;
a j-th signal output terminal group is located at a first side of the signal terminal column in the second direction and a (j+1)-th signal output terminal group is located at a second side of the signal terminal column in the second direction;
the first side of the signal terminal column and the second side of the signal terminal column are two opposing sides of the signal terminal column in the second direction;
M is an integer not less than 2;
j is a positive integer less than M; and
the plurality of signal input terminals are located between the first side of the signal terminal column and the second side of the signal terminal column.

8. The display panel according to claim 7, wherein:
connection wirings corresponding to the j-th signal output terminal group are located between the plurality of signal input terminals and the first side of the signal terminal column; and
connection wirings corresponding to the (j+1)-th signal output terminal group are located between the plurality of signal input terminals and the second side of the signal terminal column.

9. The display panel according to claim 7, wherein:
numbers of signal output terminals included in different signal output terminal groups are same.

10. The display panel according to claim 1, comprising:
a substrate;
a transistor array layer;
a planarization layer;
a connection layer; and
a light-emitting element layer,
wherein:
the transistor array layer is located between the substrate and the planarization layer;
the transistor array layer includes the plurality of first pixel driving circuits;
the connection layer is located between the planarization layer and the light-emitting element layer;
the connection layer includes the plurality of connection wirings; and
the light-emitting element layer includes the plurality of first light-emitting elements.

11. The display panel according to claim 10, wherein:
the transistor array layer includes a gate metal layer, and a source/drain metal layer located between the gate metal layer and the planarization layer;
the signal output terminal and an output terminal of the first pixel driving circuit are electrically connected through a signal output wiring; and
one of the signal output terminal and the signal output wiring is located in the gate metal layer or the source/drain metal layer.

12. The display panel according to claim 10, wherein:
the transistor array layer includes a gate metal layer, a source/drain metal layer between the gate metal layer and the planarization layer, and a transition metal layer between the source/drain metal layer and the planarization layer; and
the signal output terminal is electrically connected to the output terminal of the first pixel driving circuit through a signal output wiring, and one of the signal output terminal and the signal output wiring is located in the gate metal layer, the source/drain metal layer or the transition metal layer.

13. The display panel according to claim 12, wherein:
the output terminal of the first pixel driving circuit, the signal output terminal and the signal output wiring are located on a same layer;
the signal output wiring, the output terminal of the first pixel driving circuit and the signal output terminal are connected in a same layer; or
at least one of the output terminal of the first pixel driving circuit, the signal output terminal and the signal output wiring is disposed in a layer different from others of the output terminal of the first pixel driving circuit, the signal output terminal and the signal output wiring; and
the signal output wiring is connected to the others of the output terminal of the first pixel driving circuit, the signal output terminal and the signal output wiring and disposed in different layers through a via hole.

14. The display panel according to claim 10, wherein:
the signal input terminal is connected to at least one of the plurality of first light-emitting elements through a signal input wiring, wherein the light-emitting element layer includes an auxiliary conductive layer, an anode layer, a pixel definition layer, a light-emitting layer and a cathode;
the auxiliary conductive layer includes a plurality of signal input terminals and the signal input wiring;
the anode layer is located between the auxiliary conductive layer and the pixel definition layer;
the anode layer includes a plurality of anodes, wherein the signal input wiring is connected to an anode of the at least one first light-emitting element;
the pixel definition layer includes a hollowed portion corresponding to the anode; and
the light-emitting layer is located between the anode and the cathode and located in the hollowed portion.

15. The display panel according to claim 10, wherein:
the signal input terminal is connected to at least one of the plurality of first light-emitting elements through a signal input wiring, wherein the light-emitting element layer includes an auxiliary conductive layer, an anode layer, a pixel definition layer, a light-emitting layer and a cathode;
the auxiliary conductive layer includes a plurality of signal input terminals and the signal input wiring;
the anode layer includes a plurality of anodes;
an anode of the plurality of anodes includes a first sub-conductive layer, a metal layer and a second sub-conductive layer stacked in sequence;

the auxiliary conductive layer is disposed in a same layer as the first sub-conductive layer and/or the second sub-conductive layer;

the signal input wiring is connected to an anode of the at least one first light-emitting element;

the pixel definition layer is located between the cathode and the anode layer;

the pixel definition layer includes a hollowed portion corresponding to the anode; and the light-emitting layer is located between the anode and the cathode and in the hollowed portion.

16. The display panel according to claim 15, wherein:

the connection layer includes a transparent conductive layer; and the transparent conductive layer includes the plurality of connection wirings.

17. The display panel according to claim 15, wherein:

the connection layer includes a first transparent conductive layer, an insulation layer and a second transparent conductive layer;

the first transparent conductive layer is located between the insulation layer and the substrate;

the insulation layer is located between the first transparent conductive layer and the second transparent conductive layer;

the plurality of connection wirings are all located in the first transparent conductive layer or the second transparent conductive layer; or a portion of the plurality of connection wirings are located in the first transparent conductive layer, and another portion of the plurality of connection wirings are located in the second transparent conductive layer.

18. The display panel according to claim 17, wherein:

the auxiliary conductive layer and the second transparent conductive layer are located in a same layer;

the plurality of connection wirings are all located in the first transparent conductive layer; or a portion of the plurality of connection wirings are located in the first transparent conductive layer, and another portion of the plurality of connection wirings are located in the second transparent conductive layer.

19. A display device, comprising:

a display panel, including:

a first display area; and a second display area, wherein:

the first display area includes a display light-transmission area and a display transition area and, in a first direction, the display transition area includes a sub-display transition area located at at least one side of the display light-transmission area;

the first display area includes a plurality of first pixel driving circuits and a plurality of first light-emitting elements, and the plurality of first pixel driving circuits are all located in the display transition area;

in the display light-transmission area to the sub-display transition area, the first display area further includes a plurality of signal terminal columns arranged in a second direction, and a signal terminal column of the plurality of signal terminal columns includes a plurality of signal output terminals arranged in the first direction and a plurality of signal input terminals arranged in the first direction, the first direction and the second direction are parallel to a plane where the display panel is located, and the first direction intersects the second direction; and the first display area further includes a plurality of connection wirings extending integrally in the first direction, a signal output terminal of the plurality of signal output terminals is electrically connected with an output terminal of a first pixel driving circuit of the plurality of first pixel driving circuits, and a signal input terminal of the plurality signal input terminals is electrically connected to at least one light-emitting element of the plurality of first light-emitting elements, and the signal output terminal and the signal input terminal are electrically connected through a connection wiring of the plurality connection wirings.

20. The display device according to claim 19, comprising:

a photosensitive component overlapping with the display light-transmission area.

* * * * *